(12) United States Patent
Abe

(10) Patent No.: US 6,323,798 B1
(45) Date of Patent: Nov. 27, 2001

(54) SWITCHED CAPACITOR TYPE DIGITAL-ANALOG CONVERTER WHICH GENERATES AN ANALOG DRIVING SIGNAL FROM A DIGITAL SIGNAL BY ACTIVATION OF A CAPACITOR

(75) Inventor: Katsumi Abe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/672,263

(22) Filed: Sep. 28, 2000

(30) Foreign Application Priority Data

Oct. 5, 1999 (JP) ............................. 11-284565

(51) Int. Cl.[7] ............................. H03M 1/00; H03M 1/66
(52) U.S. Cl. ............................. 341/150; 341/136
(58) Field of Search ............................. 341/150, 120, 341/143, 161, 118, 172, 136

(56) References Cited

U.S. PATENT DOCUMENTS

| 5,684,485 | * | 11/1997 | Paillardet et al. | 341/159 |
| 5,923,275 | * | 7/1999 | Kalb | 341/150 |
| 6,054,945 | * | 4/2000 | Doyle | 341/150 |

FOREIGN PATENT DOCUMENTS

| 2-266330 | 10/1990 | (JP) . |
| 5-136696 | 6/1993 | (JP) . |
| 5-259917 | 10/1993 | (JP) . |
| 5-268097 | 10/1993 | (JP) . |
| 8-106077 | 4/1996 | (JP) . |

* cited by examiner

*Primary Examiner*—Patrick Wamsley

(57) ABSTRACT

A switched capacitor type digital-analog converter is provided with an input capacitor group, a first switch group (3-1 to 3-n) a second switch group, a reference voltage switch (6), a comparator (9), an output capacitor (2) and a short-circuit switch (7). The input capacitor group is composed of an input capacitor (1-0) and a plurality of shared input capacitors (1-1 to 1-n). The first switch group (3-1 to 3-n) applies a first voltage (V1) to the plurality of shared input capacitors (1-1 to 1-n). The second switch group applies a second voltage (V2) to the input capacitor group. The reference voltage switch (6) applies a reference voltage (Vr) to the input capacitor group. The comparator (9) compares an output of the input capacitor group with the reference voltage. An input of the output capacitor (2) is connected to an output of the input capacitor group, and an output thereof is connected to an output of the comparator (9). The short-circuit switch (7) is coupled to the output capacitor (2) in parallel. A capacitance of the output capacitor (2) is smaller than a synthesis capacitance of the input capacitor group (a total value of capacitances of the respective capacitors within the input capacitor group).

19 Claims, 17 Drawing Sheets

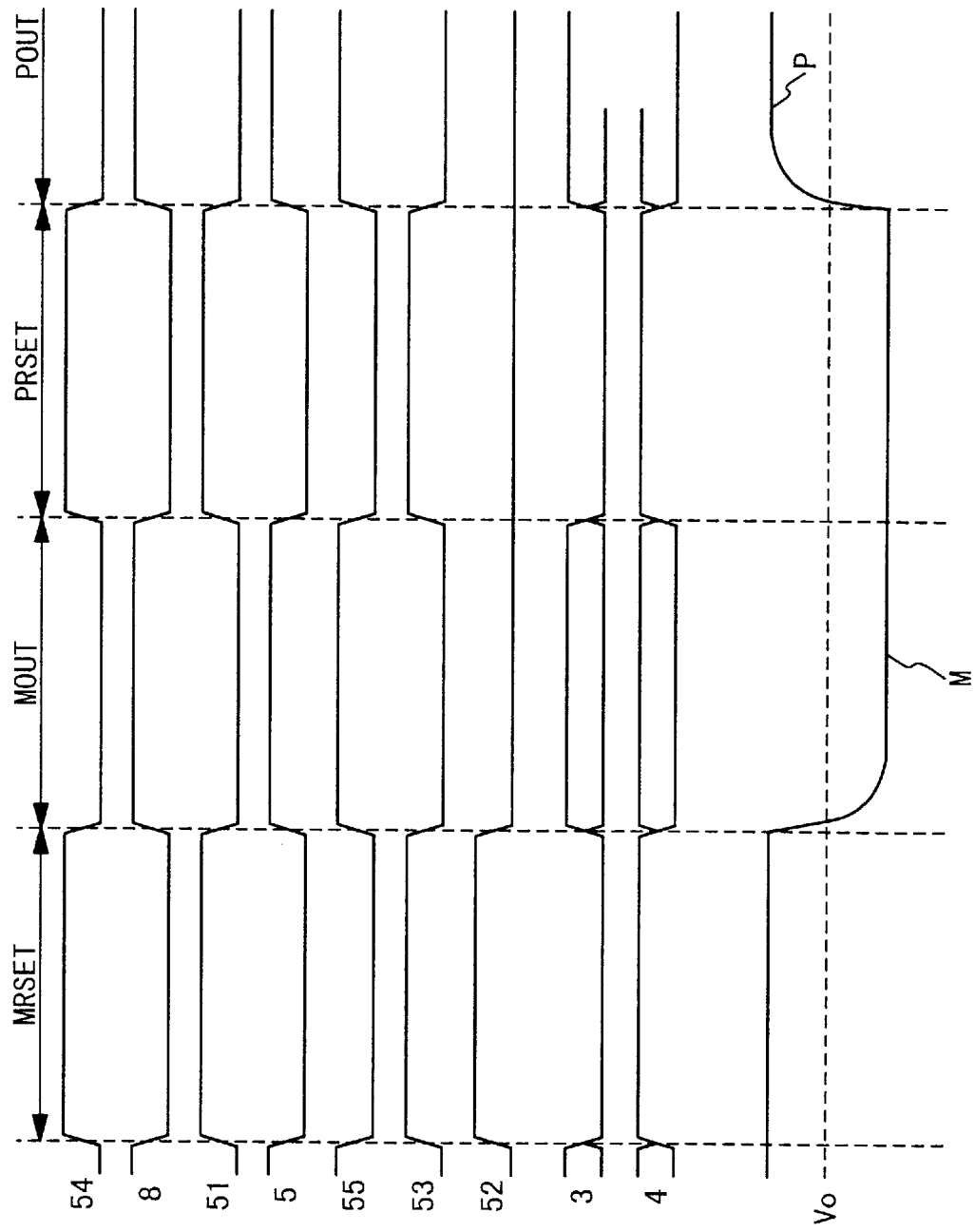

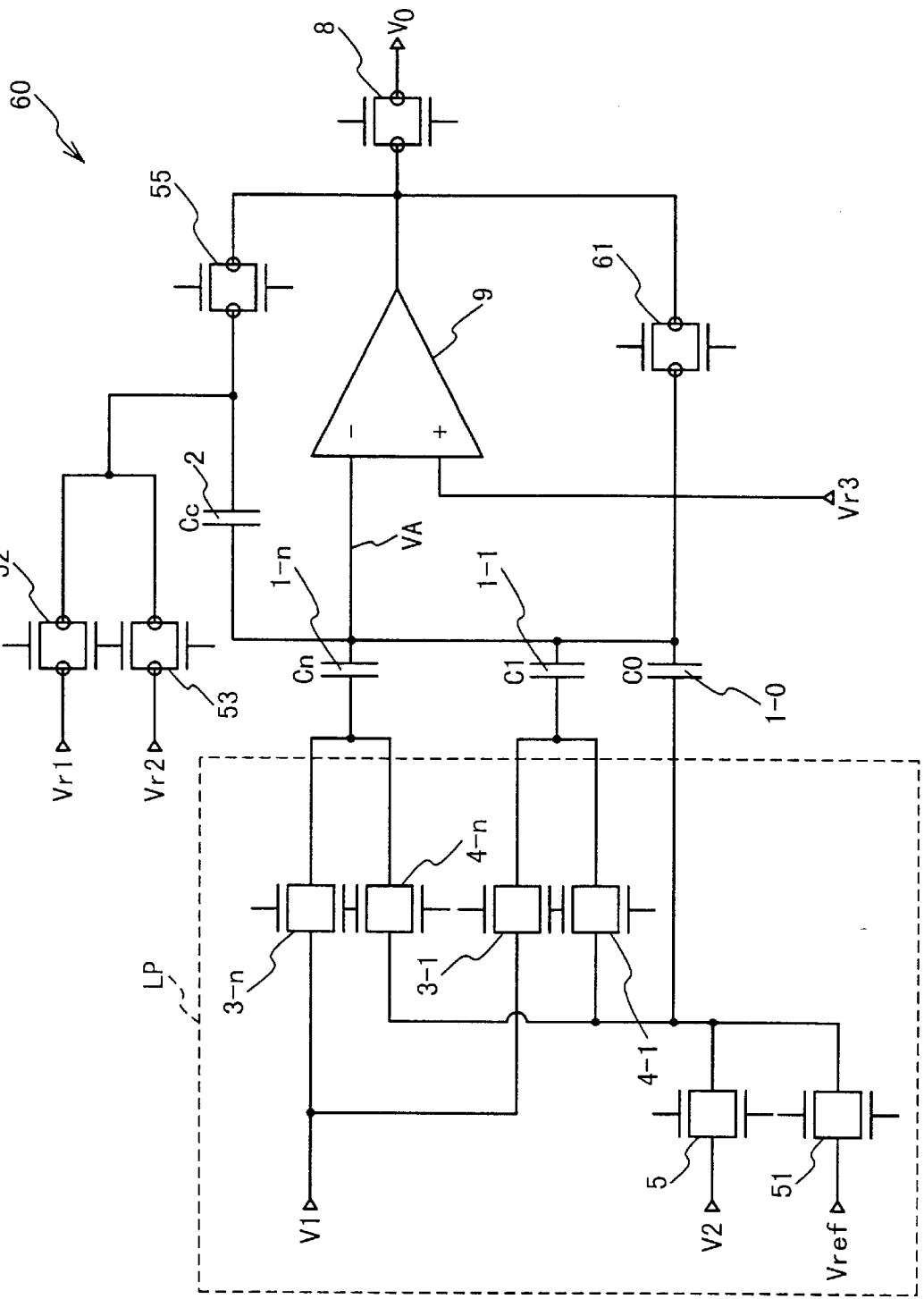

SWITCHED CAPACITOR TYPE DIGITAL-ANALOG CONVERTER WHICH GENERATES AN ANALOG DRIVING SIGNAL FROM A DIGITAL SIGNAL BY ACTIVATION OF A CAPACITOR

BACKGROUND OF THE INVENTION

1. Field of the Invention

The present invention relates to a switched capacitor type digital-analog converter, in which a selective activation of a capacitor enables a digital signal to be converted into an analog signal.

2. Description of the Related Art

A liquid crystal display (LCD) panel is used in a display of a note type computer. The LCD panel is also used as a monitor for a desktop type computer. A monitor comprising the LCD panel (LCD type monitor) is used as a variation of a CRT type monitor. A specification similar to that of the CRT is established for the LCD panel comprised by the LCD type monitor. The specification implies, for example, a screen size, a detailed degree, an image quality, a view angle and a gradient. It is necessary to satisfy the specification at a low cost in order that the LCD type monitor is popularized as the variation of the CRT type monitor.

A thin film transistor (TFT) type drive circuit (module) to drive a liquid crystal is used in the LCD panel.

FIG. 1 shows the configuration of a known TFT type LCD module. An LCD module 120 in FIG. 1 is provided with a y correction circuit 121, a signal converter 122, a source driver 123, a gate driver 124 and an LCD panel 125. An image signal (IMS) from a computer is applied to the signal converter 122.

FIG. 2 shows the configuration of a known LCD panel. An LCD panel 125 in FIG. 2 is provided with a plurality of transistor circuits 130. The transistor circuit 130 is composed of a transistor 131 and a capacitor 132.

FIG. 3 shows the configuration of a known source driver. A source driver 123 in FIG. 3 is composed of a shift register SReg, a data register DReg, a data latch DLat and a digital-analog converter DAC. To the source driver 123, a start signal SS, an outputting timing signal TS, a digital input signal SID and a reference voltage RV is applied. From the source driver 123, a cascade output signal OUT is outputted.

A fast operation and a high drive performance are set for the illustrated source driver 123 (TFT drive circuit) in order to satisfy the screen size and the detailed degree. A dynamic range between 10 and 15 V is set for the TFT drive circuit, in order to satisfy the image quality and the view angle. A digital-analog conversion performance of at least 8 bits is set for the TFT drive circuit in order to satisfy the specification with regard to the gradient.

FIG. 4 shows an operation of a dot inversion drive mode of the known TFT drive circuit. FIG. 4 shows an operation in which a plus and a minus are inverted for each dot.

A common voltage Vcom is kept constant in the dot inversion drive mode. A voltage VLCD which is applied to a liquid crystal is changed between a positive side voltage V+ and a negative side voltage V− with the common voltage Vcom as a boundary. The positive side voltage V+ is a drive voltage higher than the common voltage Vcom. The negative side voltage V− is a drive voltage lower than the common voltage Vcom.

In the dot inversion drive mode, an 8-bit digital-analog converter is used for each of the positive side voltage V+ (f1, f3, ...) and the negative side voltage V− (f2, ...) for the frame F1 and F2.

FIG. 5 shows an operation of a line inversion drive mode of the known TFT drive circuit. FIG. 5 shows an operation in which a plus and a minus are inverted for each line.

In the line inversion drive mode, a common voltage Vcom is varied for each line. When this common voltage Vcom is varied, a voltage VLCD which is applied to the liquid crystal is set at a positive side voltage V+ and a negative side voltage V−. The variation range between the positive side voltage V+ and the negative side voltage V− is equal to the common voltage Vcom. The positive side voltage V+ is a drive voltage when the common voltage Vcom is low. The negative side voltage V− is a drive voltage when the common voltage Vcom is high.

In the line inversion drive mode, one 8-bit digital-analog converter is used in the whole of the positive side voltage V+ (f1, f3, ...) and the negative side voltage V− (f2, ...) for frame F1, F2.

A TFT drive circuit operated at the dot inversion drive mode employs a digital-analog converter equal to two times the TFT drive circuit operated at the line inversion drive mode.

FIG. 6 shows a known digital-analog converter. The digital-analog converter in FIG. 6 is a switched capacitor type.

A switched capacitor type digital-analog converter 170 is provided with a high voltage process HP. Further more, the converter 170 is provided with an input capacitor 171-0, shared input capacitors 171-1 to 171-n, an output capacitor 172, switches 173-1 to 173-n, switches 174-1 to 174-n, an input switch 175, a reference voltage switch 176, a short-circuit switch 177, an output switch 178 and an operational amplifier 179.

A first voltage V1 is applied to the switches 173-1 to 173-n. Outputs of the switches 173-1 to 173-n are connected to inputs of the shared input capacitors 171-1 to 171-n. Outputs of the shared input capacitors 171-1 to 171-n are connected to an inversion input of the operational amplifier 179. The outputs of the shared input capacitors 171-1 to 171-n are connected to an input of the short-circuit switch 177. An output of the output capacitor 172 is connected to an output of the operational amplifier 179. An output of the short-circuit switch 177 is connected to the output of the operational amplifier 179. And, the output of the operational amplifier 179 is connected to an input of the output switch 178.

A second voltage V2 is applied to the input switch 175. An output of the input switch 175 is connected to an output of the reference voltage switch 176. An output of the input switch 175 is connected to an input of the input capacitor 171-0. The output of the input switch 175 is connected to inputs of the switches 174-1 to 174-n. Outputs of the switches 174-1 to 174-n are connected to the inputs of the shared input capacitors 171-1 to 171-n. An output of the input capacitor 171-0 is connected to the inversion input of the operational amplifier 179. A reference voltage Vr is applied to an input of the reference voltage switch 176. The input of the reference voltage switch 176 is connected to a non-inversion input of the operational amplifier 179. The switch has the configuration in which a p-channel transistor and an N-channel transistor are combined. The switch is set ON if the input is at a high level.

The switched capacitor type digital-analog converter 170 corresponds to an output of a positive side voltage for Vcom and an output of a negative side voltage for Vcom. The first voltage V1 is higher than the second voltage V2. Capacitances C0, C1 of the capacitors 171-0, 171-1 are a standard capacitance C. A capacitance C2 of the capacitor 171-2 is $C2=2\times C$. A capacitance C3 of the capacitor 171-3 is $C3=2\times 2\times C$. A capacitance of the capacitor 171-n is $Cn=2^{n-1}\times C$ ($n\leq 1$). A capacitance Cc of the output capacitor 172 is $Cc=2^n\times C$.

If the switched capacitor type digital-analog converter 170 is at an output state, the short-circuit switch 177 and the reference voltage switch 176 are set OFF, and the output switch 178 and the input switch 175 are set ON. If the switches 173-1 to 173-n are set ON, the switches 174-1 to 174-n are set OFF. If the switches 173-1 to 173-n are set OFF, the switches 174-1 to 174-n are set ON.

An output voltage Vo can be represented by the equation (1):

$$Vo=2\times Vr-(V2+(\alpha/2^n)\times(V1-V2)) \quad (1)$$

Here, $\alpha$ is a value of an inputted input data, and indicates a numeral between 0 and $(2^n-1)$. In a case of 8 bits, it indicates $\alpha=0$ to 255.

If the switched capacitor type digital-analog converter 170 is at a reset state, the short-circuit switch 177 and the reference voltage switch 176 are set ON, and the output switch 178 and the input switch 177 are set OFF. The switches 173-1 to 173-n are set OFF, and the switches 174-1 to 174-n are set ON. The switched capacitor type digital-analog converter 170 constitutes a voltage follower. The reference voltage Vr is applied to the inversion input of the operational amplifier 179. Potentials of the input capacitors 171-0 to 171-n and a potential of the output capacitor 172 indicate the reference voltage Vr. Charges are not accumulated in the input capacitors 171-0 to 171-n and the output capacitor 172.

If the switched capacitor type digital-analog converter 170 is at the output state, the short-circuit switch 177 and the reference voltage switch 176 are set OFF, and the output switch 178 and the input switch 177 are set OFF. The switches 173-1 to 173-n and the switches 174-1 to 174-n are set ON or OFF.

The total capacitance of the input capacitors which are activated by the switches 173-1 to 173-n and to which the first voltage V1 is applied is represented by $(\alpha\times C)$. The total capacitance of the input capacitors which are activated by the switches 174-1 to 174-n and to which the second voltage V2 is applied is represented by $((2^n-\alpha)\times C)$. Va denotes a potential of the inversion input of the operational amplifier 179. Charges accumulated in the input capacitors 171-0 to 171-n and the output capacitor 172 can be represented by the equation (2):

$$(Va-V)\times\alpha\times C+(Va-V2)\times(2n-\alpha)\times C+(Va-V0)\times C \quad (2)$$

The voltage Vr is applied to the non-inversion input of the operational amplifier 179. The voltage Va indicates a value equal to the voltage Vr. Charges of the inversion input at the operational amplifier 179 are held in the reset state and the output state. The accumulated charge at the reset state is zero, and the charge at the output state is represented by the equation (2). Thus, from a charge conservation principle, the equation (3) can be obtained:

$$0=(Va-V1)\times\alpha\times C+(Va-V2)\times(2^n-\alpha)\times C+(Va-Vo)\times Cc \quad (3)$$

The equation (1) is obtained by substituting $Cc=2^n\times C$ into the equation (3).

The techniques with regard to the switched capacitor type digital-analog converter are disclosed in Japanese Laid Open Patent Application (JP-A-H2-266330), Japanese Laid Open Patent Application (JP-A-H5-136696), Japanese Laid Open Patent Application (JP-A-H5-259917) Japanese Laid Open Patent Application (JP-A-H5-268097) and Japanese Laid Open Patent Application (JP-A-H8-106077).

The switched capacitor type digital-analog converter 170 equally divides a potential difference between the first voltage V1 and the second voltage V2. The first and second voltages V1, V2 are used to reproduce a voltage-transmission curve of the liquid crystal panel. When the dynamic range of the output voltage Vo is set between 10 and 15 V, the first and second voltages V1, V2 and the reference voltage Vr are set to be higher than 5 V.

The switches 173-1 to 173-n, the switches 174-1 to 174-n, the input switch 175 and the reference voltage switch 176 which correspond to a voltage equal to or higher than 5 V are high voltage transistors. The high voltage transistor has a wide exclusive area. The high voltage transistor disturbs the miniaturization of the switched capacitor type digital-analog converter. Especially, the high voltage transistor is an obstacle to a reduction in a chip size of an LCD driver which uses a large number of switched capacitor type digital-analog converters. Also, the high voltage transistor is an obstacle to a drop in a consumptive electric power of the digital-analog converter. Moreover, when the high voltage transistor is used, a drive signal of a high voltage must be used to drive the switch of the digital-analog converter. The drive signal of the high voltage requires a high electric power. As a result, the high voltage transistor is an obstacle to a drop in a consumptive electric power of a drive circuit for generating a drive signal.

SUMMARY OF THE INVENTION

The present invention provides a switched capacitor type digital-analog converter which is small in size and low in consumptive electric power.

The switched capacitor type digital-analog converter according to the present invention is provided with an input capacitor group, a first switch group (3-1 to 3-n), a second switch group, a reference voltage switch (6), a comparator (9), an output capacitor (2) and a short-circuit switch (7).

The input capacitor group is composed of an input capacitor (1-0) and a plurality of shared input capacitors (1-1 to 1-n). The first switch group (3-1 to 3-n) applies a first voltage (V1) to the plurality of shared input capacitors (1-1 to 1-n). The second switch group applies a second voltage (V2) to the input capacitor group. The reference voltage switch (6) applies a reference voltage (Vr) to the input capacitor group. The comparator (9) compares an output of the input capacitor group with the reference voltage. An input of the output capacitor (2) is connected to an output of the input capacitor group, and an output thereof is connected to an output of the comparator (9). The short-circuit switch (7) is coupled to the output capacitor (2) in parallel. A capacitance of the output capacitor (2) is smaller than a synthesis capacitance of the input capacitor group (a total value of capacitors of the respective capacitors within the input capacitor group).

Another switched capacitor type digital-analog converter according to the present invention is provided with a first switch group (3-1 to 3-n) and a second switch group (4-1 to 4-n). The reference voltage switch (6) is composed of low voltage transistors. And, the short-circuit switch (7) is composed of the high voltage transistors.

In another switched capacitor type digital-analog converter according to the present invention, the low voltage transistor is driven at a voltage equal to or less than 3.3 V.

In another switched capacitor type digital-analog converter according to the present invention, the first voltage (V1) indicates a higher potential than the second voltage (V2).

In another switched capacitor type digital-analog converter according to the present invention, the comparator (9) is an operational amplifier including an inversion input (−) receiving the output of the input capacitor group and a non-inversion input (+) receiving the second voltage or the reference voltage.

In another switched capacitor type digital-analog converter according to the present invention, capacitors (1-1 to 1-n) of the plurality of shared capacitors have a capacitance equal to integer times that of the input capacitor (1-0).

BRIEF DESCRIPTION OF THE DRAWINGS

FIG. 16 shows an operational wave form of the fifth embodiment of the switched capacitor type digital-analog converter according to the present invention; and FIG. 17 shows a sixth embodiment of the switched capacitor type digital-analog converter according to the present invention.

DESCRIPTION OF THE PREFERRED EMBODIMENTS

Figure 1:
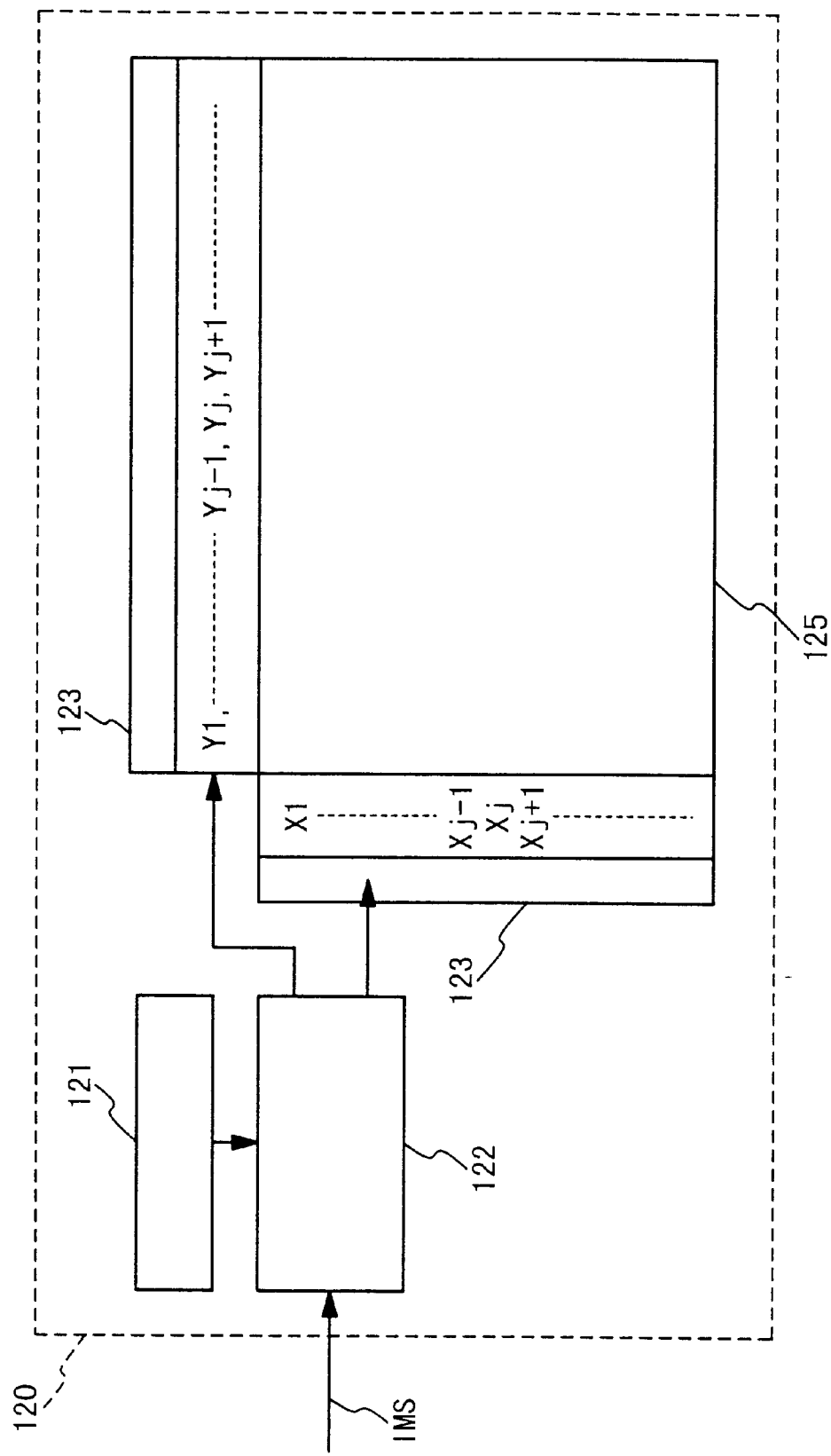
FIG. 1 shows a configuration of a known TFT type LCP module.
Figure 2:
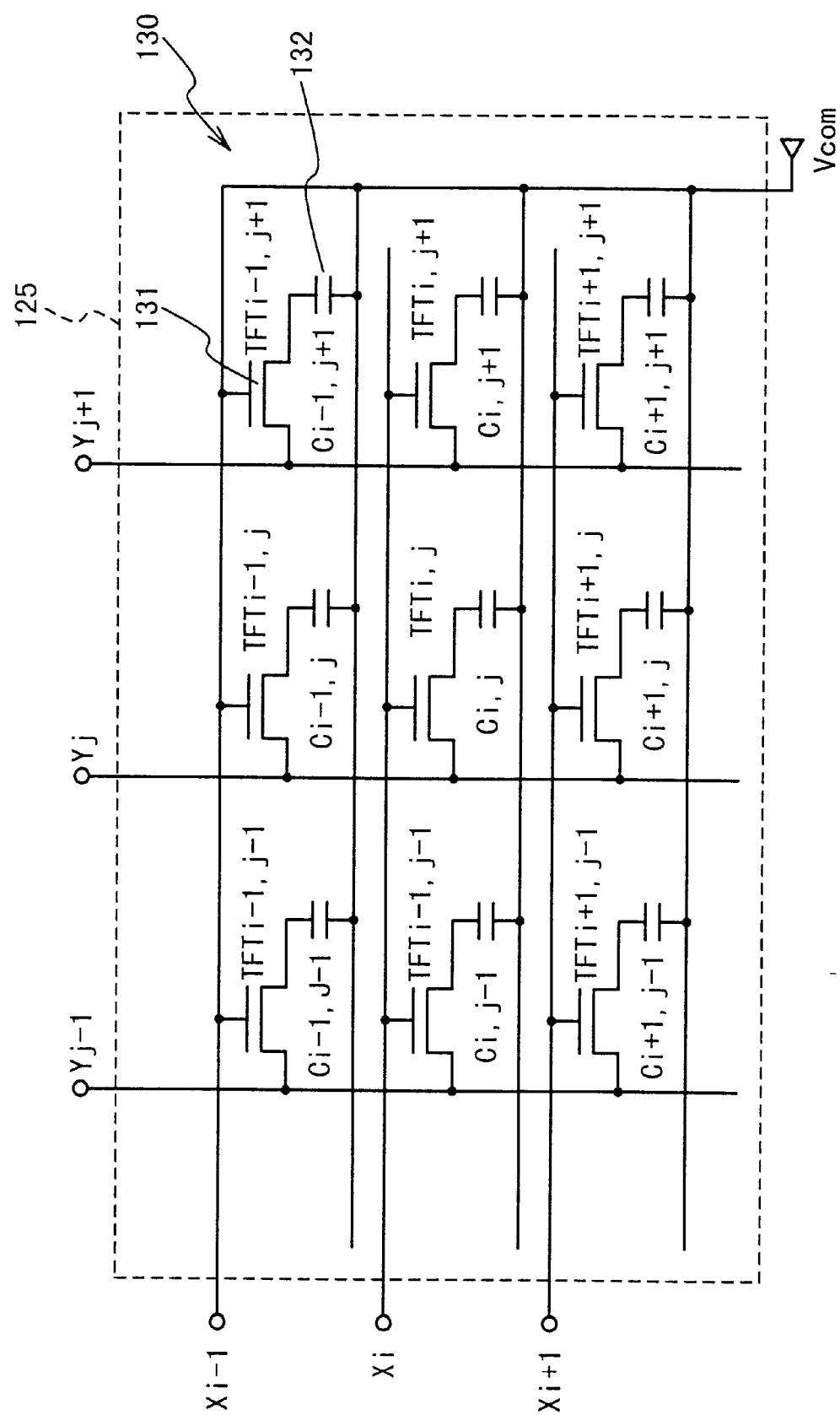
FIG. 2 shows a configuration of a known LCD panel.
Figure 3:
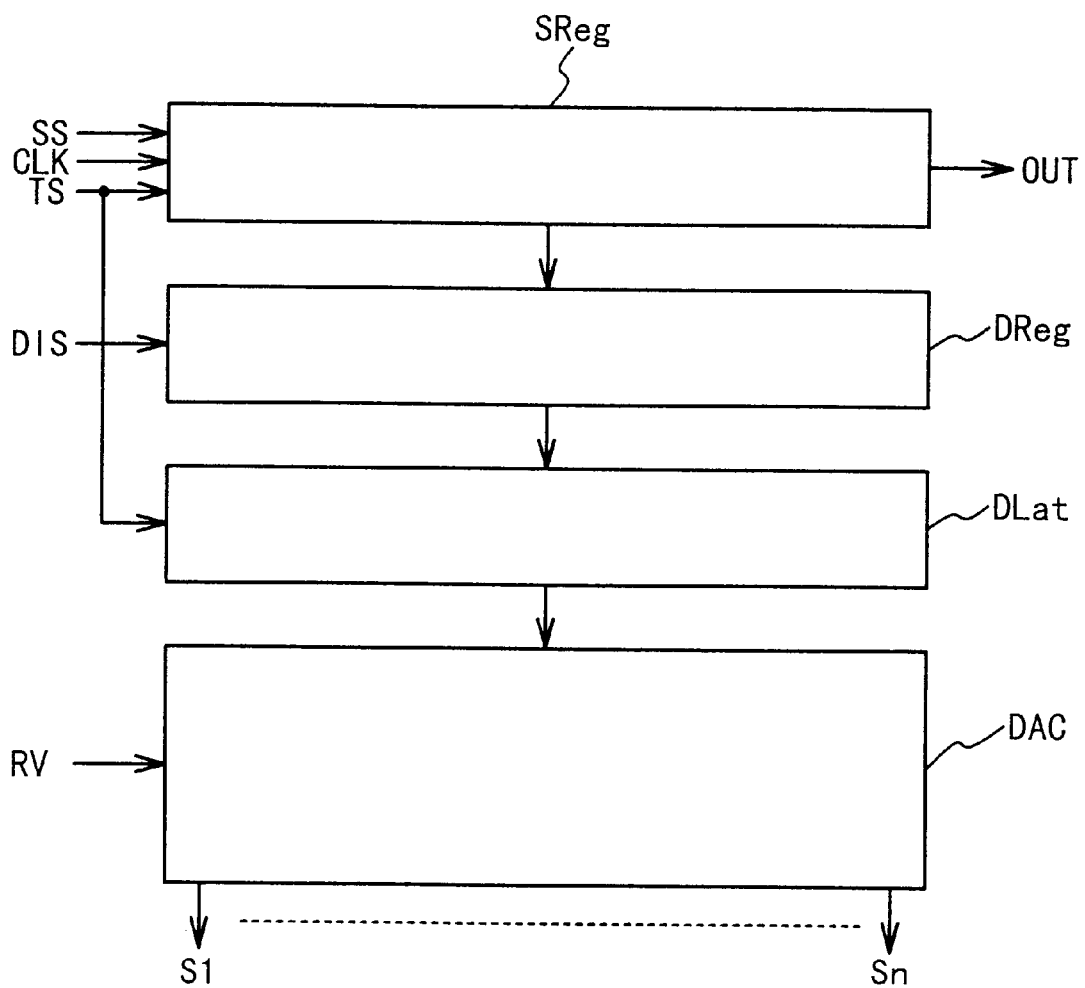
FIG. 3 shows a configuration of a known source driver.
Figure 4:
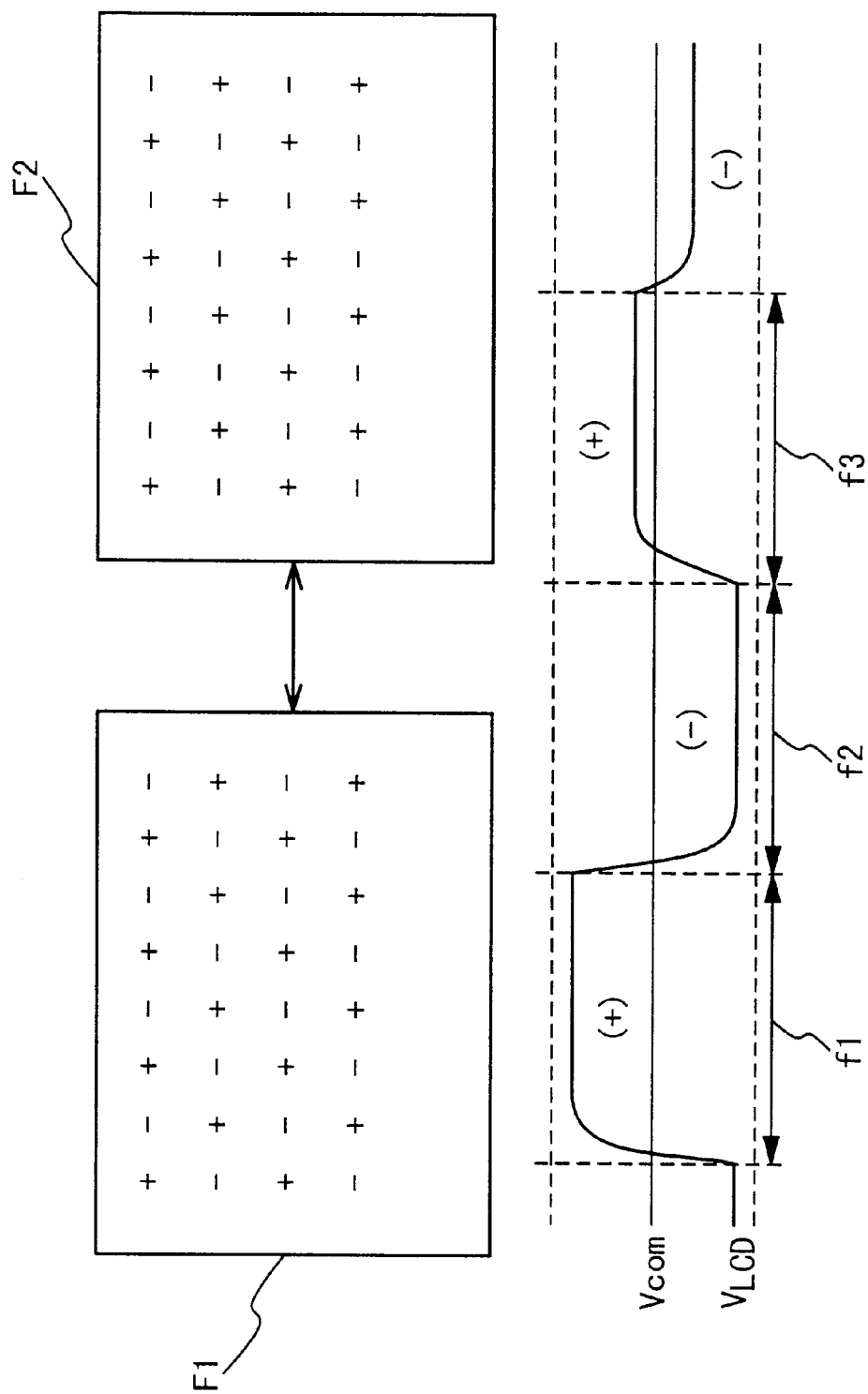
FIG. 4 shows an operation of a dot inversion drive mode of a known TFT drive circuit.
Figure 5:
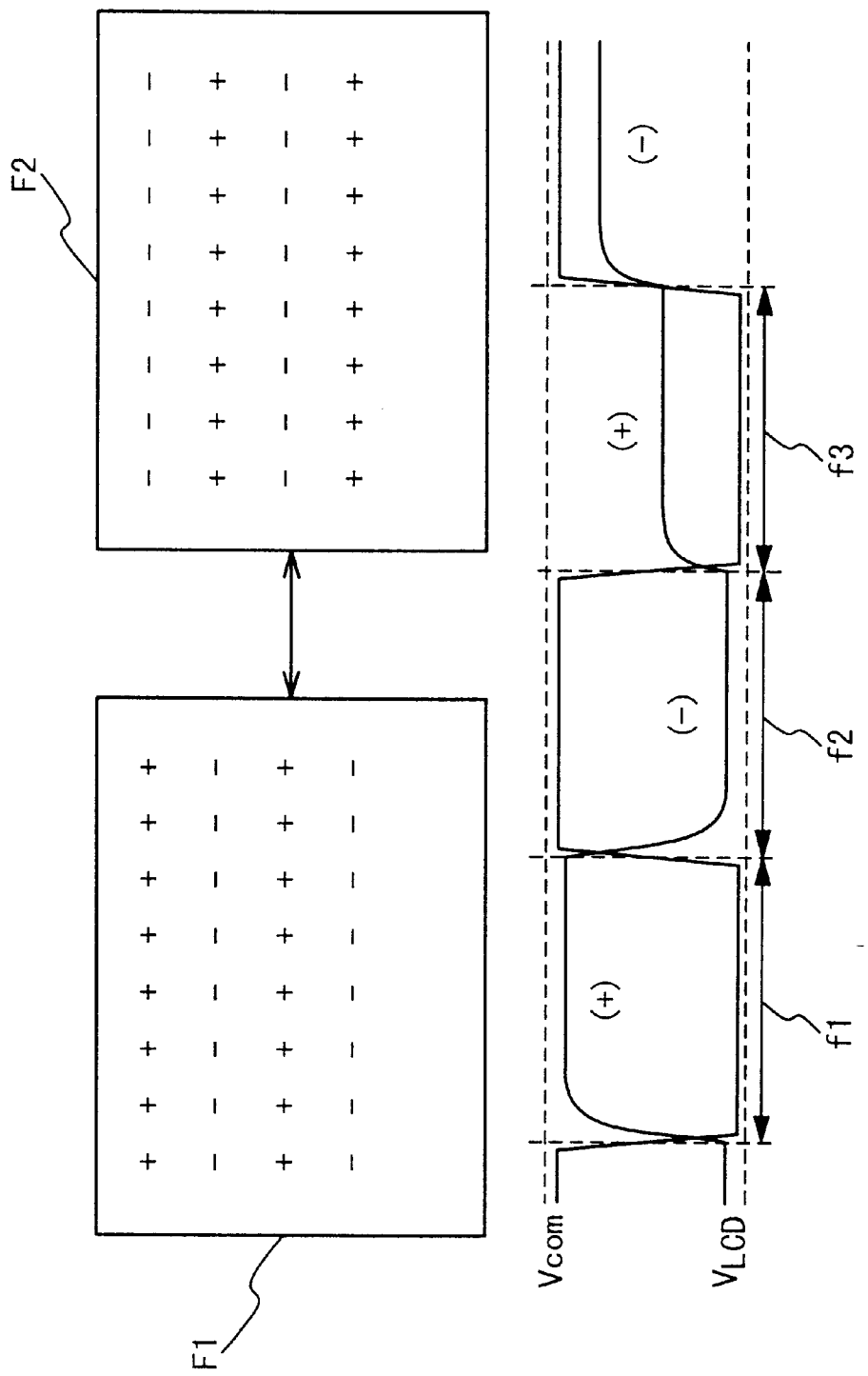
FIG. 5 shows an operation of a line inversion drive mode of a known TFT drive circuit.
Figure 6:
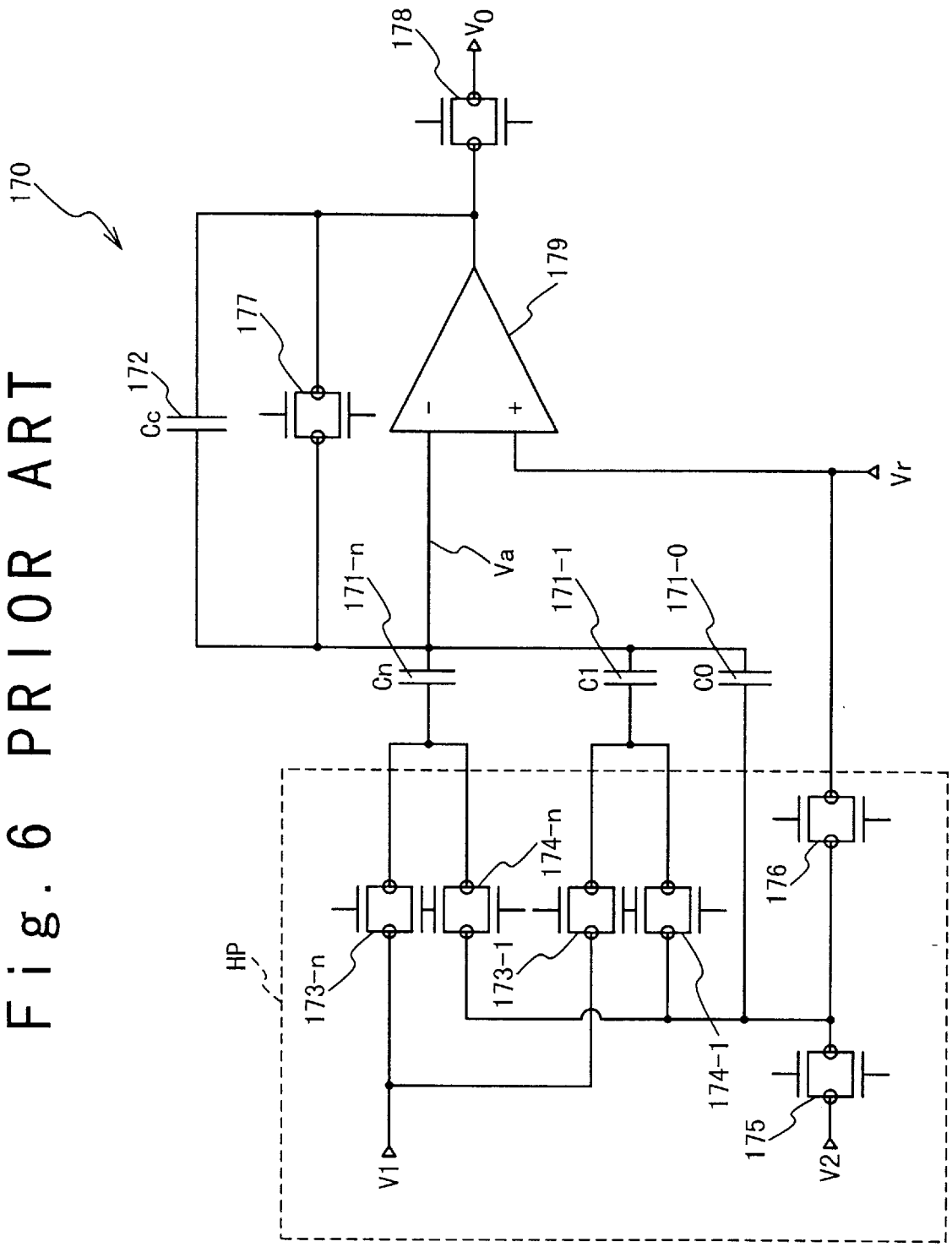
FIG. 6 shows a known digital-analog converter.
Figure 7:
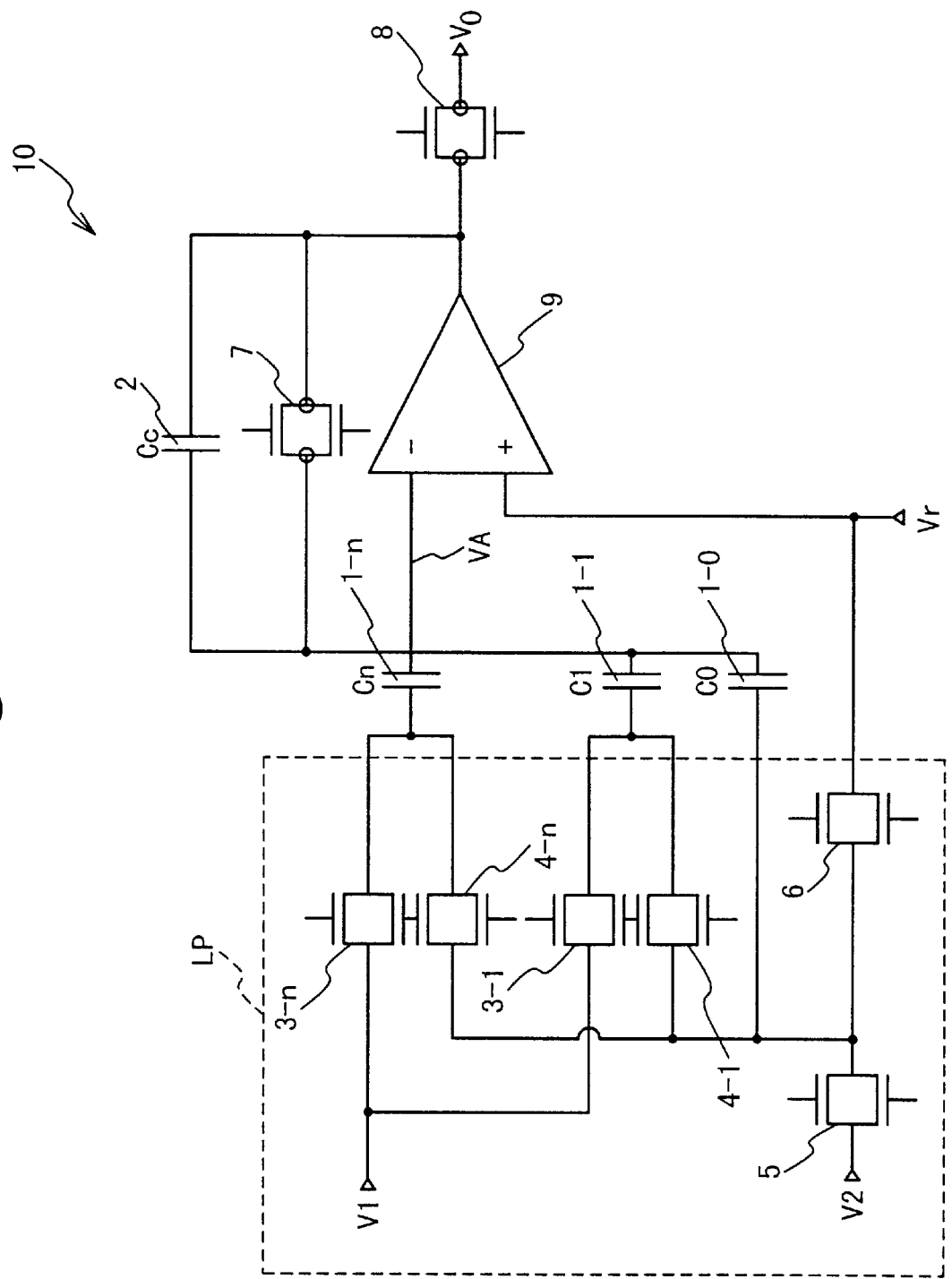
FIG. 7 shows an embodiment of a switched capacitor type digital-analog converter according to the present invention.

FIG. 7 shows a switched capacitor type digital-analog converter according to the present invention. The components surrounded by the dots line in the switched capacitor type digital-analog converter 10 shown in FIG. 7 are provided with a low voltage process (LP). The other components are provided with a high voltage process (HP). Furthermore, the converter 10 is provided with an input capacitor 1-0, shared input capacitors 1-1 to 1-n, an output capacitor 2, switches 3-1 to 3-n, switches 4-1 to 4-n, an input switch 5, a reference voltage switch 6, a short-circuit switch 7, an output switch 8 and an operational amplifier 9.

The input capacitor group is composed of the input capacitor 1-0 and the shared input capacitors 1-1 to 1-n. The first switch group is composed of the switches 3-1 to 3-n. The second switch group is composed of the switches 4-1 to 4-n.

A first voltage V1 is applied to the switches 3-1 to 3-n. Outputs of the switches 3-1 to 3-n are connected to inputs of the shared input capacitors 1-1 to 1-n. Outputs of the shared input capacitors 1-1 to 1-n are connected to an inversion input of the operational amplifier 9. The outputs of the shared input capacitors 1-1 to 1-n are connected to an input of the short-circuit switch 7. An output of the output capacitor 2 is connected to an output of the operational amplifier 9. An output of the short-circuit switch 7 is connected to the output of the operational amplifier 9. And, the output of the operational amplifier 9 is connected to an input of the output switch 8.

A second voltage V2 is applied to the input switch 5. An output of the input switch 5 is connected to an output of the reference voltage switch 6. An output of the input switch 5 is connected to an input of the input capacitor 1-0. The output of the input switch 5 is connected to inputs of the switches 4-1 to 4-n. Outputs of the switches 4-1 to 4-n are connected to the inputs of the shared input capacitors 1-1 to 1-n. An output of the input capacitor 1-0 is connected to the inversion input of the operational amplifier 9. A reference voltage Vr is applied to an input of the reference voltage switch 6. The input of the reference voltage switch 6 is connected to a non-inversion input of the operational amplifier 9. The switch has the configuration in which a p-channel transistor and an N-channel transistor are combined. The switch is set ON if the input digital data is at a high level.

The switched capacitor type digital-analog converter 10 can make an output of the positive side voltage for Vcom and an output of the negative side voltage for Vcom. The first voltage V1 is higher than the second voltage V2. Capacitances C0, C1 of the capacitors 1-0, 1-1 are a standard capacitance C. A capacitance C2 of the capacitor 1-2 is C2=2×C. A capacitance C3 of the capacitor 1-3 is C3=2×2 ×C. A capacitance of the capacitor 1-n is $Cn=2^{n-1} \times C (n \leq 1)$. A capacitance Cc of the output capacitor 2 is Cc=a×C. The constant a is a value determined in accordance with the first voltage V1, the second voltage V2 and an output voltage Vo.

The switches 3-1 to 3-n, the switches 4-1 to 4-n, the input switch 5 and the reference voltage switch 6 are composed of the low voltage transistors. The low voltage transistor is driven at a voltage equal to or less than 3.3 V. The switches 7, 8 are composed of the high voltage transistors. The high voltage transistor can correspond to a voltage equal to or higher than 5 V.

Figure 8:
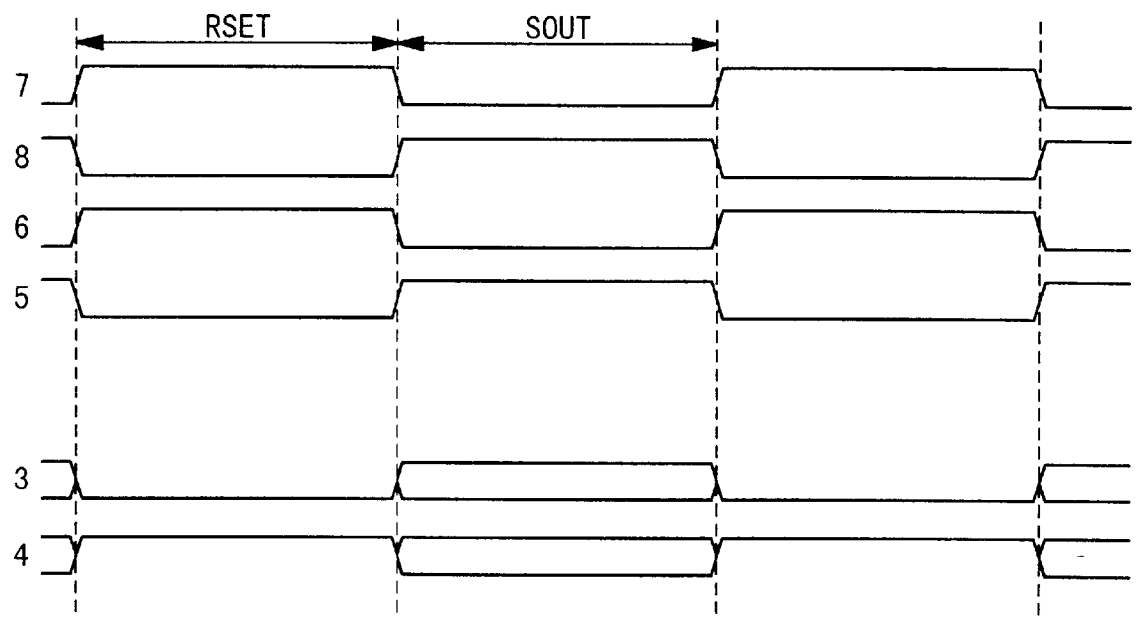
FIG. 8 shows an operational wave form of the switched capacitor type digital-analog converter according to the present invention.

FIG. 8 shows an operational wave form of the switched capacitor type digital-analog converter 10 according to the present invention. If the switched capacitor type digital-analog converter 10 is at an output state (Sout), the switches 6, 7 are set OFF. The switches 5, 8 are set ON. If the switches 3-1 to 3-n are set ON based on input digital data, the switches 4-1 to 4-n are set OFF. If the switches 3-1 to 3-n are set OFF, the switches 4-1 to 4-n are set ON.

The output voltage Vo can be represented by the equation (4):

$$V_o=(1+(2^n/a))\times V_r-(2^n/a)\times(V_2+(\alpha/2^n))\times(V_1-V_2) \quad (4)$$

$\alpha$ is a value corresponding to an input n-bit data, and indicates a numeral between 0 and ($2^n$1). In a case of an 8-bit data, the $\alpha$ indicates a numeral between 0 and 255.

If the switched capacitor type digital-analog converter 10 is at a reset state (Rset), the switches 6, 7 are set ON. The switches 5, 8 are set OFF. The switches 3-1 to 3-n are set OFF. The switches 4-1 to 4-n are set ON. The switched capacitor type digital-analog converter 10 constitutes the voltage follower. The voltage Vr is applied to the inversion input of the operational amplifier 9. The voltage Vr is applied to the capacitors 1-0 to 1-n and the capacitor 2. Charges are not accumulated in the input capacitors 1-0 to 1-n and the output capacitor 2.

The switched capacitor type digital-analog converter 10 is changed from the reset state to the output state. The switches 6, 7 are set OFF. The switches 5, 8 are set ON. The switches 3-1 to 3-n and the switches 4-1 to 4-n are set ON or OFF in accordance with the input digital data. A total capacitance of the capacitors to which the voltage V1 is applied through the switches 3-1 to 3-n is represented by ($\alpha \times C$). A total capacitance of the capacitors to which the voltage V2 is applied through the switches 4-1 to 4-n is represented by (($2^n-\alpha$)×C). In the charges accumulated in the capacitors 1-0 to 1-n and the capacitor 2, when a potential of the inversion input of the operational amplifier 9 is VA, the equation (5) is established as follows:

$$(V_A-V_1)\times\alpha\times C+(V_A-V_2)\times(2^n-\alpha)\times C+(V_A-V_o)\times C_c \quad (5)$$

The reference voltage Vr is applied to the non-inversion input of the operational amplifier 9. A voltage VA is equal to the voltage Vr. The switched capacitor type digital-analog converter 10 holds the charges when it is at the reset state and the output state. The accumulated charge at the reset state is zero, and the accumulated charge at the output state is represented by the equation (5). Thus, from the charge conservation principle, the equation (6) can be obtained:

$$0=(V_A-V_1)\times\alpha\times C+(V_A-V_2)\times(2^n-\alpha)\times C+(V_A-V_c)\times C_c \quad (6)$$

The equation (4) is obtained by changing the equation (6) into which (Cc=a×C) is substituted. The output voltage Vo is generated by multiplying the reference voltage Vr by $(1+(2^n/a))$ and multiplying $(V_2+(\alpha/2^n))\times(V_1-V_2)$ by $(2^n/a)$. For example, let us suppose that V1=0.6V and V2=0.5V when n=2, a=1 and Vr=2.5V. Then, in a case of $\alpha$=0, the output voltage Vo can be represented by the equation (7):

$$V_o=(1+(4/1))\times 2.5-(4/1)\times(0.5+0\times(2.5-0.5))=10.5V \quad (7)$$

Let us suppose n, a and Vr are equal to the above-mentioned values, respectively. Then, in a case of V1=2.9V, V2=2.8V and $\alpha$=3, the output voltage Vo can be represented by the following equation (8):

$$V_o=(1+(4/1))\times 2.5-(4/1)\times(2.8+(3/4)\times(2.9-2.8))=1.0V \quad (8)$$

Although the reference voltage Vr, the first voltage V1 and the second voltage V2 are at the low voltage level, it is possible to output the output of the high voltage level.

The input voltages (V1, V2) can be amplified when the capacitance of the output capacitor 2 is made smaller than the total capacitance of the input capacitors 1-0 to 1-n. The switches 3-1 to 3-n, the switches 4-1 to 4-n, the input switch 5 and the reference voltage switch 6 can be composed of the low voltage transistors.

Figure 9:
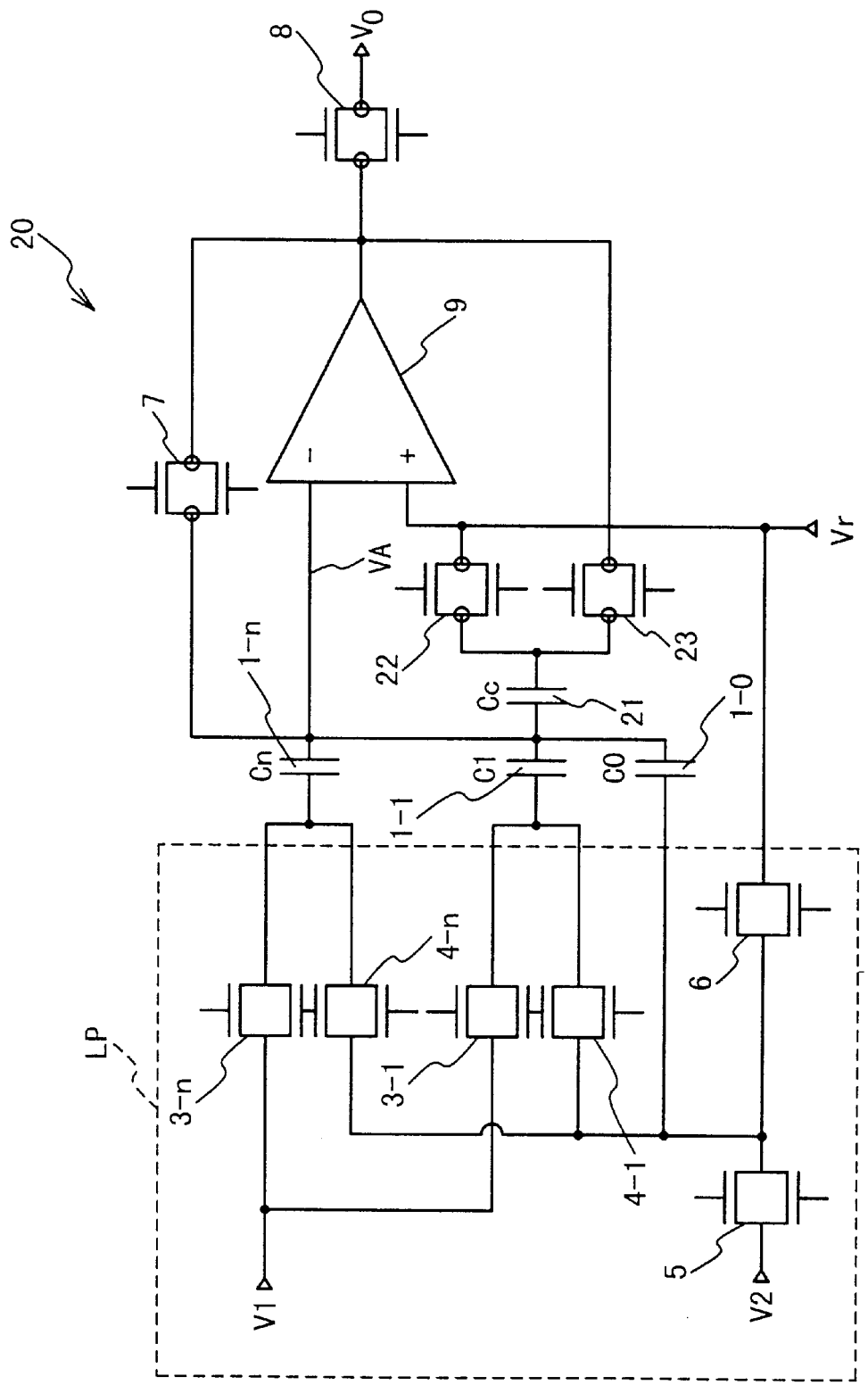
FIG. 9 shows a second embodiment of the switched capacitor type digital-analog converter according to the present invention.

FIG. 9 shows a second embodiment of the switched capacitor type digital-analog converter according to the present invention. A switched capacitor type digital-analog converter 20 in FIG. 9 is provided with a low voltage process (LP). Furthermore, the converter 20 is provided with an input capacitor 1-0, shared input capacitors 1-1 to 1-n, switches 3-1 to 3-n, switches 4-1 to 4-n, an input switch 5, a reference voltage switch 6, a short-circuit switch 7, an output switch 8, an operational amplifier 9, an output capacitor 21, a first capacitor output switch 22 and a second capacitor output switch 23.

The input capacitor 1-0, the shared input capacitors 1-1 to 1-n, the switches 3-1 to 3-n, the switches 4-1 to 4-n, the input switch 5, the reference voltage switch 6, the short-circuit switch 7, the output switch 8 and the operational amplifier 9 have the configurations equal to the configurations shown in FIG. 7, respectively.

An input of the output capacitor 21 is connected to an inversion input of the operational amplifier 9. An output of the output capacitor 21 is connected to an input of the first capacitor output switch 22 and an input of the second capacitor output switch 23. An output of the first capacitor output switch 22 is connected to a non-inversion input 22 of the operational amplifier 9. An output of the second capacitor output switch 23 is connected to an output of the operational amplifier 9.

The first capacitor output switch 22 and the second capacitor output switch 23 are composed of the high voltage transistors. The switched capacitor type digital-analog converter 20 can cancel an offset voltage of the operational amplifier 9.

Figure 10:
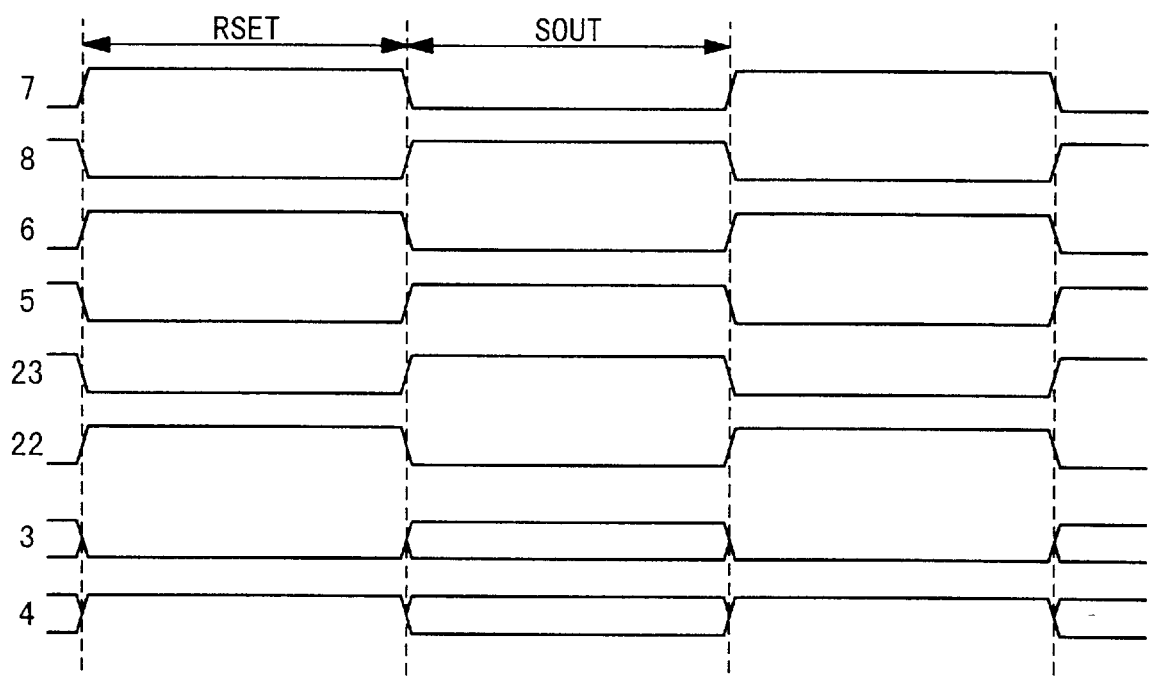
FIG. 10 shows an operational wave form of the second embodiment of the switched capacitor type digital-analog converter according to the present invention.

FIG. 10 shows an operational wave form of the switched capacitor type digital-analog converter 20 according to the present invention.

When the switched capacitor type digital-analog converter 20 is at the reset state (Rset), the switches 6, 7 and 22 are set ON. The switches 5, 8 and 23 are set OFF. The switches 3-1 to 3-n are set OFF. The switches 4-1 to 4-n are set ON. And, the switched capacitor type digital-analog converter 20 is set at the voltage follower. A voltage (Vr+Voff) is applied to the inversion input of the operational amplifier 9. The voltage Voff is the offset voltage of the operational amplifier 9. The reference voltage Vr is applied through the switches 3-1 to 3-n, the switches 4-1 to 4-n and the switch 6 to the input sides of the input capacitors 1-0 to 1-n. The reference voltage Vr is applied through the switch 23 to the output side of the output capacitor 21. A total charge Qr accumulated in the input capacitors and the output capacitors can be represented by the equation (9):

$$Q_r=(V_r+V_{off}-V_r)\times 2^n\times C+(V_r+V_{off}-V_r)\times a\times C=(V_{off})\times(2^n+a)\times C \quad (9)$$

When the switched capacitor type digital-analog converter 20 is changed from the reset state to the output state (Sout), the switches 6, 7 and 22 are set OFF. The switches 5, 8 and 23 are set ON. The switches 3-1 to 3-n and the switches 4-1 to 4-n are set ON or OFF, in accordance with the input digital data.

A total capacitance of the input capacitors to which the first voltage V1 is applied is represented by ($\alpha \times C$). A total capacitance of the capacitors to which the second voltage V2 is applied is represented by (($2^n-\alpha$)×C). A voltage of the inversion input of the operational amplifier 9 is represented by VA. A total charge Qo accumulated in the input capacitors 1-0 to 1-n and the output capacitor 21 can be represented by the equation (10):

$$Q_o=(V_A-V_1)\times\alpha\times C+(V_A-V_2)\times(2^n-\alpha)\times C+(V_A-V_o)\times a\times C \quad (10)$$

Qr=Qo can be established from the charge conservation principle. (VA=Vr+Voff) can be established in the state that the output is stable. Its state can be represented by the equation (11)

$$(Voff) \times (2^n+a) \times C = (Vr+Voff-V1) \times \alpha \times C + (Vr+Voff-V2) \times (2^n-\alpha) \times C + (Vr+Voff-Vo) \times a \times C \quad (11)$$

The equation (12) can be obtained by changing the equation (11) with regard to the output voltage Vo:

$$Vo = (1+(2^n-a)) \times Vr - (2^n/a) \times (V2 + \alpha/2^n \times (V1-V2)) \quad (12)$$

The voltage Vo does not depend on the offset voltage of the operational amplifier 9.

As for the output voltage Vo of the switched capacitor type digital-analog converter 10 shown in FIG. 7, when the offset voltage of the operational amplifier 9 is considered, the equation (13) can be obtained:

$$Vo = (1+(2^n/a)) \times Vr - (2^n/a) \times (V2 + (\alpha/2^n) \times (1-V2)) + (2^n/a) \times Voff_o \quad (13)$$

When a plurality of switched capacitor type digital-analog converters are used as in the case of the LCD driver, if the offset voltages Voff of the operational amplifiers do not coincide with each other, the variation is induced in the output voltage. This variation may cause the image quality to be degraded.

The switched capacitor type digital-analog converter 20 according to the present invention can cancel the offset voltage of the operational amplifier which causes the image quality to be degraded.

Figure 11:
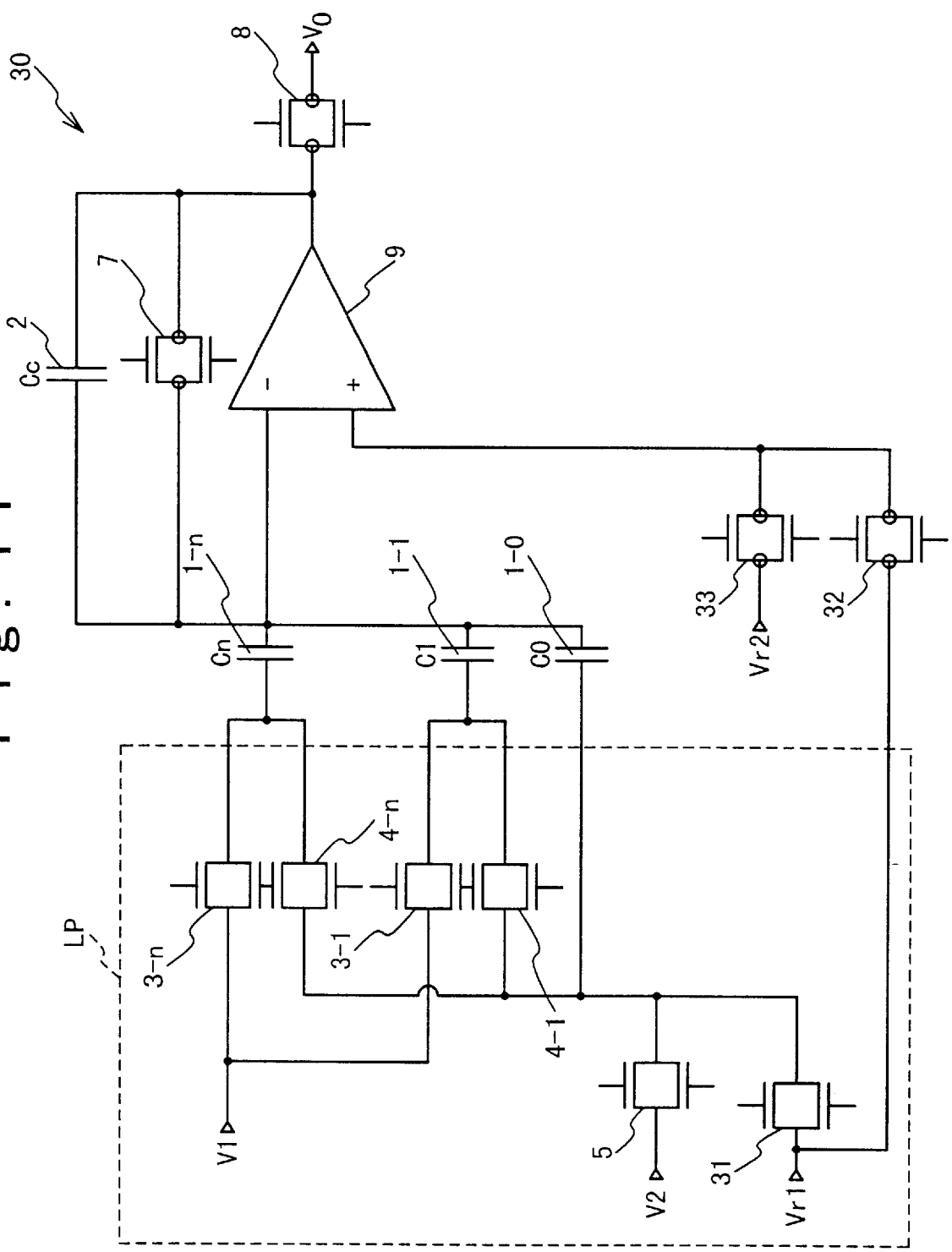
FIG. 11 shows a third embodiment of the switched capacitor type digital-analog converter according to the present invention.

FIG. 11 shows a third embodiment of the switched capacitor type digital-analog converter according to the present invention. The components surrounded by dots line in a switched capacitor type digital-analog converter 30 in FIG. 11 are provided with a low voltage process (LP). The other components are provided with a high voltage process (HP). Furthermore, the converter 30 is provided with an input capacitor 1-0, shared input capacitors 1-1 to 1-n, an output capacitor 2, switches 3-1 to 3-n, switches 4-1 to 4-n, an input switch 5, a reference voltage switch 6, a short-circuit switch 7, an output switch 8, an operational amplifier 9, a first reference voltage switch 31, a second reference voltage switch 32 and a third reference voltage switch 33.

The input capacitor 1-0, the shared input capacitors 1-1 to 1-n, the output capacitor 2, the switches 3-1 to 3-n, the switches 4-1 to 4-n, the input switch 5, the reference voltage switch 6, the short-circuit switch 7, the output switch 8 and the operational amplifier 9 have the configurations equal to the configurations shown in FIG. 7, respectively.

An output of the first reference voltage switch 31 is connected to an output of the input switch 5. An input of the second reference voltage switch 32 is connected to an input of the first reference voltage switch 31. An output of the second reference voltage switch 32 is connected to a non-inversion input of the operational amplifier 9. An output of the third reference voltage switch 33 is connected to a non-inversion input of the operational amplifier 9. A first reference voltage Vr1 is applied to the input of the first reference voltage switch 31. A second reference voltage Vr2 is applied to the input of the third reference voltage switch 33.

The first reference voltage Vr1 is a low voltage. The second reference voltage Vr2 is a high voltage. The first reference voltage switch 31 is composed of the low voltage transistors. The second reference voltage switch 32 is composed of the high voltage transistors. And, the third reference voltage switch 33 is composed of the high voltage transistors.

The usage of the first reference voltage Vr1 and the second reference voltage Vr2 enables a dynamic range of the output voltage Vo to be wider. In this case, to make a dynamic range of the output voltage wider, the change of a capacitance of a usage capacitor doesn't need.

Figure 12:
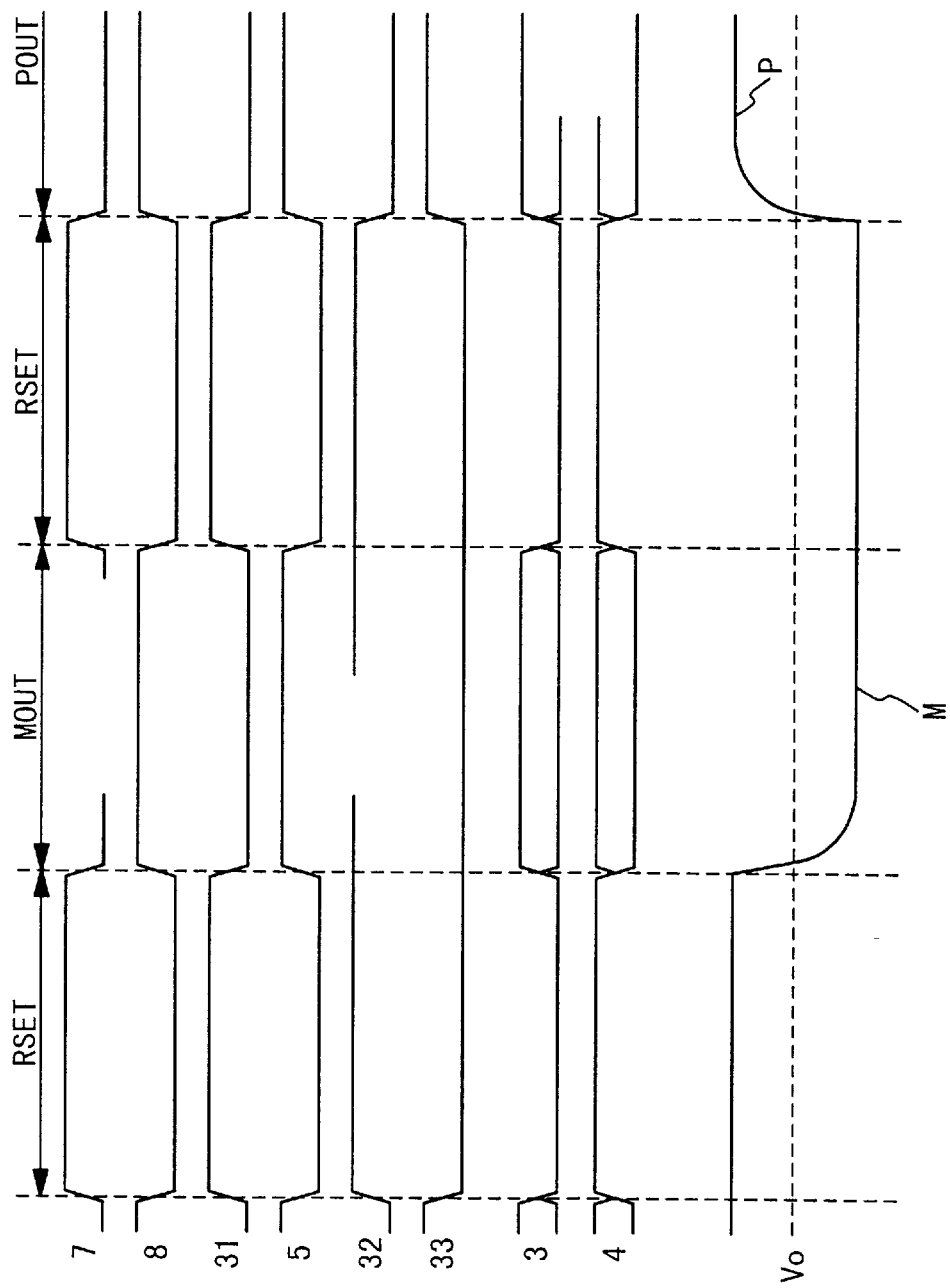
FIG. 12 shows an operational wave form of the third embodiment of the switched capacitor type digital-analog converter according to the present invention.

FIG. 12 shows an operational wave form of the switched capacitor type digital-analog converter 30 according to the present invention.

When the switched capacitor type digital-analog converter 30 is at the reset state (Rset), the switches 7, 31 and 32 are set ON. The switches 5, 8 and 33 are set OFF. The switches 3-1 to 3-n are set OFF. The switches 4-1 to 4-n are set ON. And, the switched capacitor type digital-analog converter 30 is set at the voltage follower.

The reference voltage Vr1 is applied to the inversion input of the operational amplifier 9. The reference voltage Vr1 is applied to the capacitors 1-0 to 1-n and the output capacitor 2. Charges are not accumulated in the capacitors 1-0 to 1-n.

The switched capacitor type digital-analog converter 30 is set at an output state. The switched capacitor type digital-analog converter 30 is operated at a positive output mode (Pout), in a case of (Vop>Vcom) The switches 7, 31 and 32 are set OFF. The switches 5, 8 and 33 are set ON. The switches 3-1 to 3-n and the switches 4-1 to 4-n are set ON or OFF.

A total capacitance of the capacitors to which the first voltage V1 is applied is represented by $(\alpha \times C)$. And, a total capacitance of the capacitors to which the second voltage V2 is applied is represented by $((2^n-\alpha) \times C)$. Charges accumulated in the capacitors 1-0 to 1-n and the output capacitor 2 can be represented by the equation (14):

$$(VA-V1) \times \alpha \times C + (VA-V2) \times (2^n-\alpha) \times C + (VA-Vo) \times Cc \quad (14)$$

The voltage VA indicates a potential of the inversion input of the operational amplifier 9. The voltage VA when the output voltage Vo becomes stable indicates VA=Vr2 if the offset voltage of the operational amplifier 9 is ignored. An output voltage Vop at this time can be represented by the equation (15):

$$Vop = (1+(2^n/a)) \times Vr2 - (2^n/a) \times (V2 + (\alpha/2^n) \times (V1-V2)) \quad (15)$$

The switched capacitor type digital-analog converter 30 is operated at a negative output mode (Mout), in a case of (Von<Vcom). The switches 7, 31 and 32 are set OFF. The switches 5, 8 and 33 are set ON. The switches 3-1 to 3-n and the switches 4-1 to 4-n are set ON or OFF.

A total capacitance of the capacitors to which the first voltage Vi is applied is represented by $(\alpha \times C)$. And, a total capacitance of the capacitors to which the second voltage V2 is applied is represented by $((2^n-\alpha) \times C)$. Charges accumulated in the capacitors 1-0 to 1-n and the output capacitor 2 can be represented by the equation (16):

$$(VA-V1) \times \alpha \times C + (VA-V2) \times (2^n-\alpha) \times C + (VA-Vo) \times Cc \quad (16)$$

The voltage VA when the output voltage Vo becomes stable is equal to the first voltage V1. An output voltage Von at this time can be represented by the equation (17):

$$Von = (1+(2^n/a)) \times Vr1 - (2^n-a) \times (V2 + (\alpha/2^n) \times (V1-V2)) \quad (17)$$

When n=2, a=2, Vr1=2.2V, Vr2=4.5V, V1=0.3V, V2=0.2V and α=0, the output voltage Vop of the positive pole output mode is 13.1 V as represented by the equation (18):

$$Vop = (1+(4/2))4.5 - (4/2) \times (0.2+0 \times ((0.3-0.2)) = 13.1V \quad (18)$$

When the values of n, a, Vr1 and Vr2 are kept and then V1=2.9V, V2=2.8V and α=3 are set, the output voltage Von of the negative pole output mode is 0.85 V as represented by the equation (19).

$$\text{Von}=(1+(4/2))\times 2.2-(4/2)\times(2.8+(3/4)\times(2.92-2.8))=0.85\text{V} \quad (19)$$

The switched capacitor type digital-analog converter 30 has a merit that a range of the output voltage can be made wider without changing an amplification degree which can realize a change of the capacitance.

Figure 13:
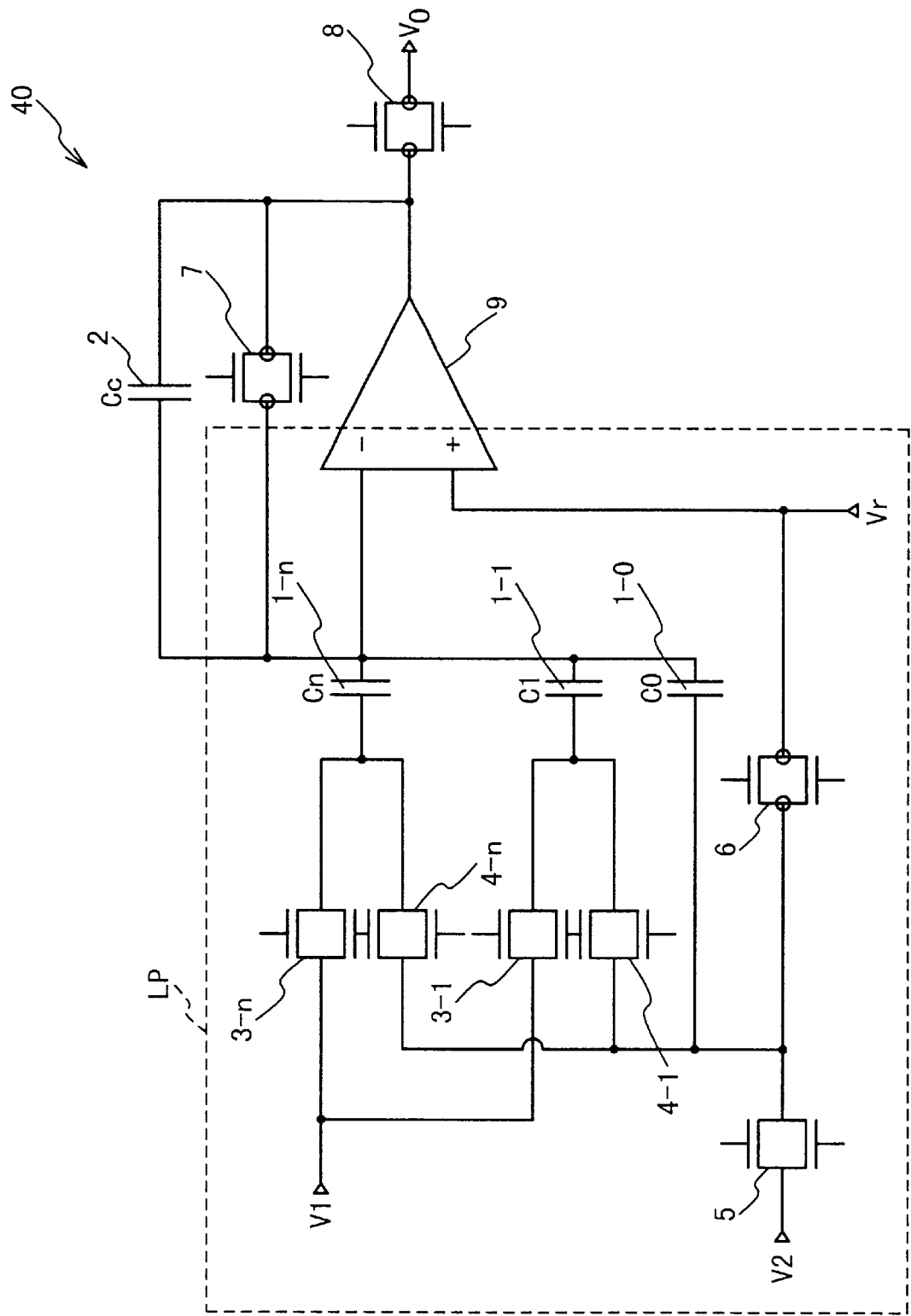
FIG. 13 shows a fourth embodiment of the switched capacitor type digital-analog converter according to the present invention.

FIG. 13 shows a fourth embodiment of the switched capacitor type digital-analog converter according to the present invention. The components surrounded by dots line in a switched capacitor type digital-analog converter 40 in FIG. 13 are provided with a low voltage process (LP). The other components are provided with a high voltage process (HP). Furthermore, the converter 40 is provided with an input capacitor 1-0, shared input capacitors 1-1 to 1-n, an output capacitor 2, switches 3-1 to 3-n, switches 4-1 to 4-n, an input switch 5, a reference voltage switch 6, a short-circuit switch 7, an output switch 8, and an operational amplifier 41.

This converter 40 is different in configuration of the operational amplifier 9 from the switched capacitor type digital-analog converter 10 shown in FIG. 7. The operational amplifier 9 is an amplifier of a type corresponding to a high voltage. The operational amplifier 41 is an amplifier of a type corresponding to a low voltage.

Figure 14:
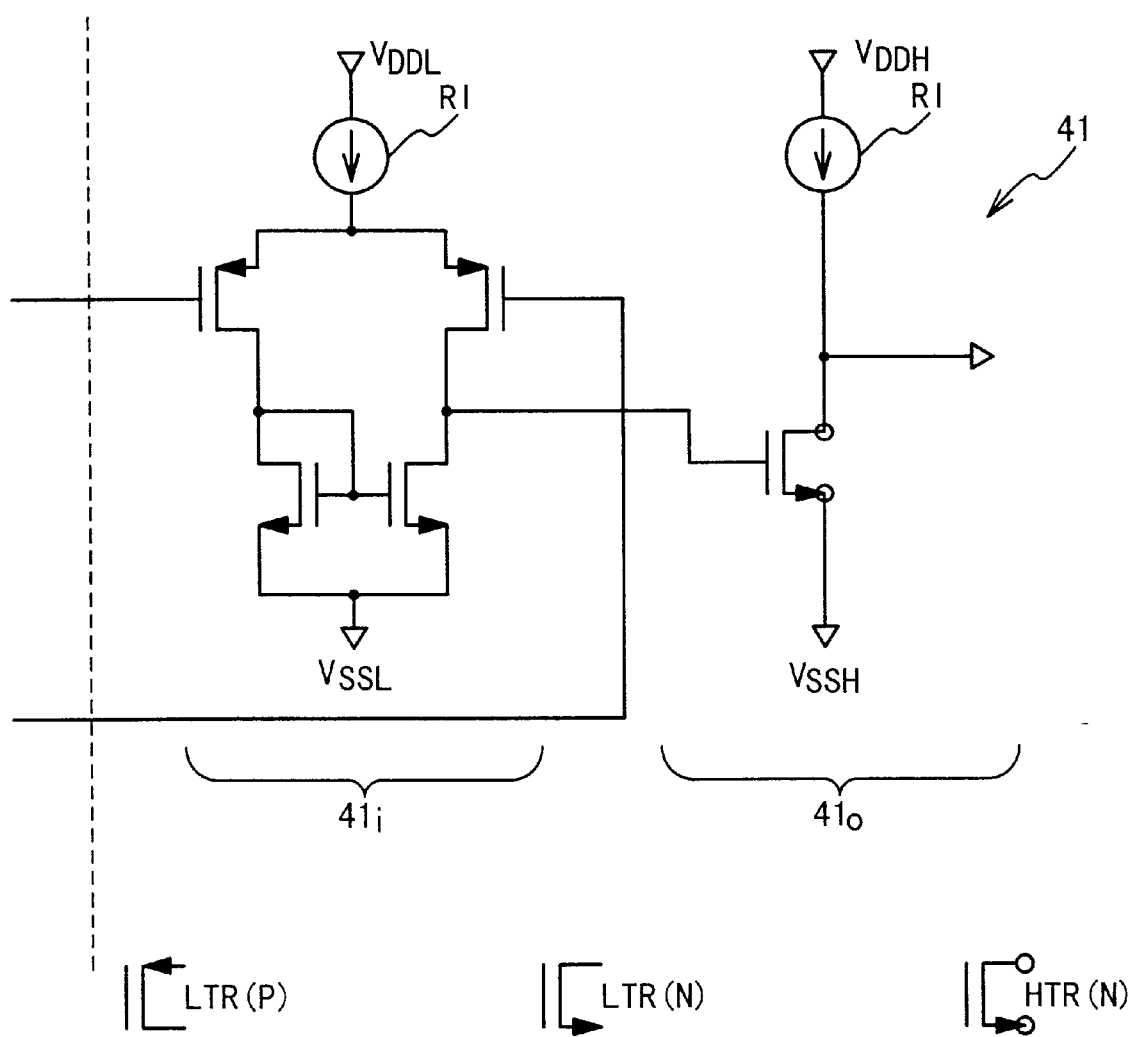
FIG. 14 shows an inner circuit of an operational amplifier according to the present invention.

FIG. 14 shows an inner circuit of the operational amplifier 41. The operational amplifier 41 shown in FIG. 14 is composed of an input side circuit 41i and an output side circuit 41o. The input side circuit 41i is provided with a current source RI, a low voltage P-ch MOS transistor LTR(P) and a low voltage N-ch MOS transistor LTR (N). The output side circuit 41o is provided with a current source RI and a high voltage N-ch MOS transistor HTR (N).

A low voltage power source VDDL and a low voltage ground VSSL are coupled to the input side circuit 41i. A high voltage power source VDDH and a high voltage ground VSSH are coupled to the output side circuit 41o.

An input voltage of the input side circuit 41i (a differential stage) of the operational amplifier 41 is a low voltage. An output similar to that of the operational amplifier 9 can be generated even if the input side circuit 41i is a circuit corresponding to the low voltage.

The switched capacitor type digital-analog converter according to the present invention establishes the input side circuit 41i as the circuit corresponding to the low voltage. The establishment of the input side circuit 41i corresponding to the low voltage can reduce the consumptive electric power of the operational amplifier.

Figure 15:
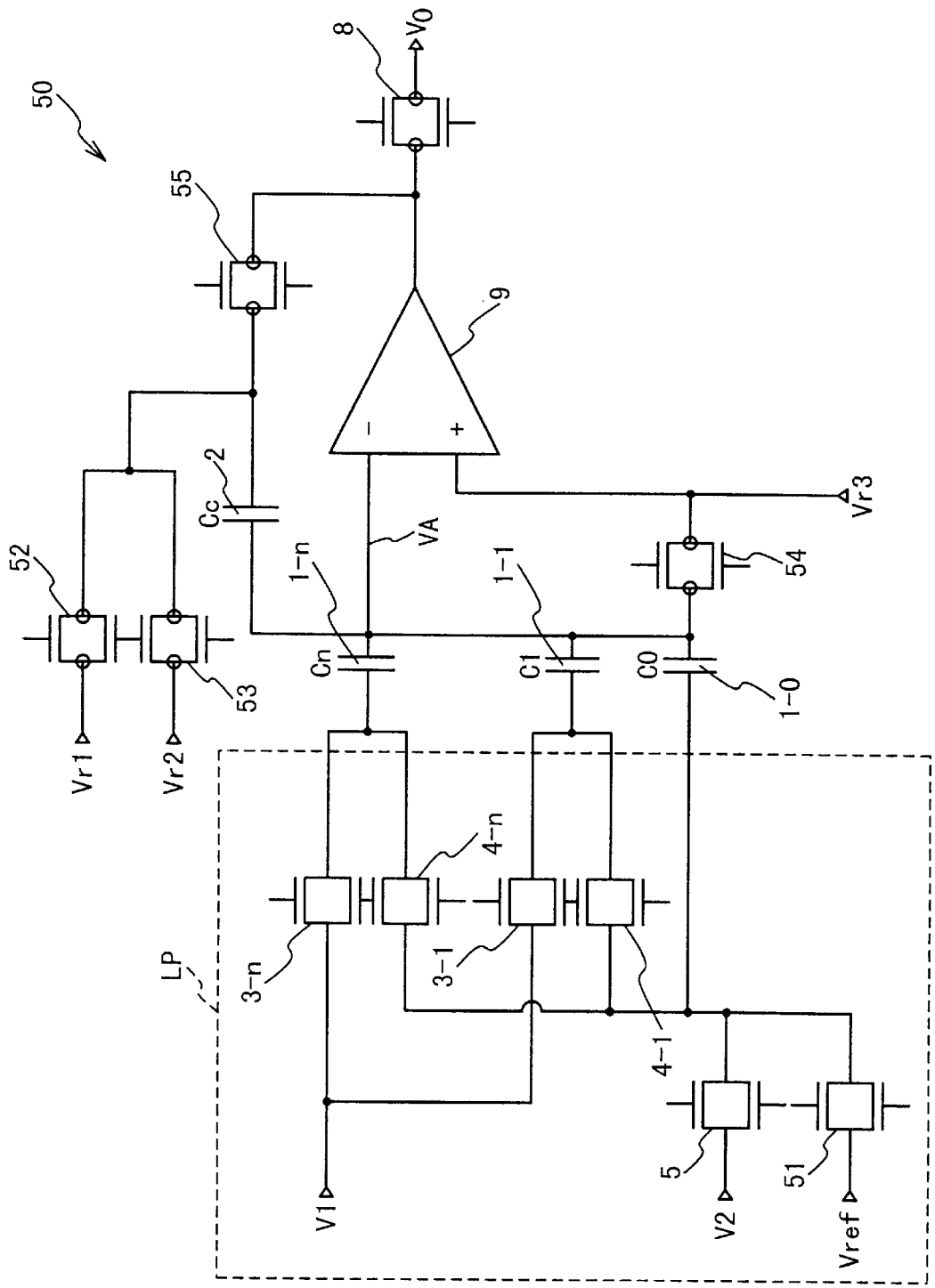
FIG. 15 shows a fifth embodiment of the switched capacitor type digital-analog converter according to the present invention.

FIG. 15 shows a fifth embodiment of the switched capacitor type digital-analog converter according to the present invention. The components surrounded by dots line in a switched capacitor type digtal-analog converter 50 in FIG. 15 are provide with a low voltage process (LP). The other components are provided with a high voltage process (HP). Furthermore, the converter 50 is provided with an input capacitor 1-0, shared input capacitors 1-1 to 1-n, an output capacitor 2, switches 3-1 to 3-n, switches 4-1 to 4-n, an input switch 5, an output switch 8, an operational amplifier 9, a first reference voltage switch 51, a second reference voltage switch 52, a third reference voltage switch 53, a fourth reference voltage switch 54 and a short-circuit switch 55.

The input capacitor 1-0, the shared input capacitors 1-1 to 1-n, the output capacitor 2, the switches 3-1 to 3-n, the switches 4-1 to 4-n, the input switch 5, the output switch 8 and the operational amplifier 9 have the configurations equal to the configurations shown in FIG. 7, respectively.

An output of the first reference voltage switch 51 is connected to an output of the input switch 5. An output of the second reference voltage switch 52 is connected to an output of the output capacitor 2. An output of the third reference voltage switch 53 is connected to the output of the output capacitor 2. An input of the fourth reference voltage switch 54 is connected to a non-inversion input of the operational amplifier 9. An output of the fourth reference voltage switch 54 is connected to an inversion input of the operational amplifier 9. An input of the short-circuit switch 55 is connected to the output of the output capacitor 2. And, an output of the short-circuit switch 55 is connected to an output of the operational amplifier 9.

A first reference voltage Vref is applied to an input of the first reference voltage switch 51. A second reference voltage Vr1 is applied to an input of the second reference voltage switch 52. A third reference voltage Vr2 is applied to an input of the third reference voltage switch 53. A fourth reference voltage Vr3 is applied to an input of the fourth reference voltage switch 54.

The first reference voltage switch 51 is composed of the low voltage transistors. The second to fourth reference voltage switches 52 to 54 and the short-circuit switch 55 are composed of the high voltage transistors.

The first reference voltage Vref indicates an operational reference voltage of the switched capacitor type digital-analog converter 50. The second reference voltage Vr1 is a reference voltage to be used when the switched capacitor type digital-analog converter 50 is operated at the positive operation mode. The third reference voltage Vr2 is a reference voltage to be used when the switched capacitor type digital-analog converter 50 is operated at the negative operation mode. And, the fourth reference voltage Vr3 is a reference voltage to be connected to the inversion input of the operational amplifier 9.

FIG. 16 shows an operational wave form of the switched capacitor type digital-analog converter 50 according to the present invention. The operational wave form in FIG. 16 is generated when the switched capacitor type digital-analog converter 50 is set at the reset state of the negative operation mode (M).

The switched capacitor type digital-analog converter 50 indicates the reset state (Mrset) of the negative pole operation mode. The switches 54, 51 and 53 are set ON. The switches 5, 8, 52 and 55 are set OFF. The switches 3-1 to 3-n are set OFF. And, the switches 4-1 to 4-n are set ON.

The fourth reference voltage Vr3 is applied to the inversion input of the operational amplifier 9. The first reference voltage Vref is applied through the switches 4-1 to 4-n to the capacitors 1-0 to 1-n. The third reference voltage Vr2 is applied through the switch 53 to the output capacitor 2.

A total charge Qrn accumulated in the capacitors 1-0 to 1-n and the capacitor 2 can be represented by the equation (20):

$$\text{Qrn}=(\text{Vr3}-\text{Vref})\times 2^n\times C+(\text{Vr3}-\text{Vr2})\times a \times C \quad (20)$$

If the switched capacitor type digital-analog converter 50 indicates the negative pole output state (Mout), the switches 54, 51 and 53 are set OFF. The switches 5, 8, 52 and 55 are set ON. The switches 3-1 to 3-n and the switches 4-1 to 4-n are set ON or OFF.

A total capacitance of the capacitors to which the first voltage V1 is applied is represented by ($\alpha\times C$). And, a total capacitance of the capacitors to which the second voltage V2 is applied is represented by (($2^n-\alpha)\times C$). Charges Qo accumulated in the capacitors 1-0 to 1-n and the capacitor 2 in a case of the negative pole output mode can be represented by the equation (21):

$$\text{Qo}=(\text{VA}-\text{V1})\times\alpha\times C+(\text{VA}-\text{V2})\times(2^n-\alpha)\times C+(\text{VA}-\text{Vo})\times\text{Cc} \quad (21)$$

In the voltage VA when an output voltage Vo becomes stable, VA=Vr3 is established if the offset voltage of the operational amplifier 9 is ignored. When a charge conservation principle Qrn=Qo and the equations (15), (16) are checked, a negative pole output voltage Von can be represented by the equation (22):

$$Von=\{Vr2+(2^n/a)\times Vref\}-(2^n/a)\times\{V2+(\alpha/2^n)\times(V1-V2)\} \quad (22)$$

The switched capacitor type digital-analog converter 50 is set at the reset state (Prset) of the positive operation mode. In this case, the switches 54, 51 and 52 are set ON. The switches 5, 8, 53 and 55 are set OFF. The switches 3-1 to 3-n are set OFF. And, the switches 4-1 to 4-n are set ON.

The fourth reference voltage Vr3 is applied to the inversion input of the operational amplifier 9. The first reference voltage Vref is applied through the switches 4-1 to 4-n to the capacitors 1-0 to 1-n. And, the second reference voltage Vr1 is applied through the switch 52 to the output capacitor 2.

A total charge Qrp accumulated in the capacitors 1-0 to 1-n and the capacitor 2 can be represented by the equation (23):

$$Qrp=(Vr3-Vref)\times 2^n\times C+(Vr3-Vr1)\times a\times C \quad (23)$$

The switched capacitor type digital-analog converter 50 is set at the output state (Pout) of the positive pole output mode. In this case, the switched capacitor type digital-analog converter 50 has the same switch setting as the case when it is set at the output state of the negative pole output mode. At this time, charges Qo accumulated in the capacitors 1-0 to 1-n and the capacitor 2 can be represented by the equation (24):

$$Qo=(VA-V1)\times \alpha \times C+(Va-V2)\times(2^n-\alpha)\times C+(VA-Vo)\times C \quad (24)$$

At this time, in accordance with a charge conservation principle Qrp=Qo and the equations (23), (24), a positive pole output voltage Vop can be represented by the equation (25):

$$Vop=\{Vr1+(2^n/a)\times Vref\}-(2^n/a)\times\{V2+(\alpha/2^n)\times(V1-V2)\} \quad (25)$$

V1=0.3V and V2=0.2V are set when n=2, a=2, Vref=2.0V, Vr1=9.5V and Vr2=2.5V. When $\alpha$=0, the output voltage Vop is 13.1 V as represented by the equation (26):

$$Vop=(9.5+2\times 2)-2\times\{0.2+(0)\times(0.3-0.2)\}=13.1V \quad (26)$$

Then, V1=2 .9V and V2=2.8V are set. In a case of $\alpha$=3, the output voltage Von is 0.75 V as represented by the equation (27):

$$Von=(2.5+2\times 2)-2\times\{2.9+(3/4)\times(2.9-2.8)\}=0.75V \quad (27)$$

In the switched capacitor type digital-analog converter 50, an output range can be made wider without the increase of an amplification degree.

The fourth reference voltage Vr3 is always applied to the non-inversion input of the operational amplifier 9 in the switched capacitor type digital-analog converter 50. The switched capacitor type digital-analog converter has a parasitic capacitance of wiring, a parasitic capacitance generated between the capacitors 1-0 to 1-n and a substrate and a parasitic capacitance generated between the capacitor 2 and the substrate. An output error caused by the influence of those parasitic capacitance is brought about when the charge conservation principles are considered. The variation of the output caused by the variation of the parasitic capacitance is induced in the LCD driver including a large number of switched capacitor type digital-analog converters.

A different voltage depending on the polarity of the output is applied to the non-inversion input of the operational amplifier 9 shown in the third embodiment according to the present invention. In this case, the output voltage is easily changed. There are the positive pole output and the negative pole output in the polarity of the output.

As shown in the fifth embodiment according to the present invention, when the switch 51 and the reference voltages Vref, Vr3 are set, the fourth reference voltage Vr3 is applied to the non-inversion input of the operational amplifier 9. The fourth reference voltage Vr3 is the low voltage. In this case, charges, which are always constant, are accumulated in the parasitic capacitance. That is, the accumulated charge at the reset state is equal to the accumulated charge at the output state. Thus, the output is not changed because of the influence of the parasitic capacitance. The parasitic capacitance has no influence on the output voltage, in the configuration of the fifth embodiment according to the present invention. This configuration can provide the switched capacitor type digital-analog converter in which a high output accuracy is required.

FIG. 17 shows a sixth embodiment of the switched capacitor type digital-analog converter according to the present invention. The components surrounded by dots line in a switched capacitor type digital-analog converter 60 in FIG. 17 are provided with a low voltage process (LP). The other components are provided with a high voltage process (HP). Furthermore, the converter 60 is provided with an input capacitor 1-0, shared input capacitors 1-1 to 1-n, an output capacitor 2, switches 3-1 to 3-n, switches 4-1 to 4-n, an input switch 5, an output switch 8, an operational amplifier 9, a first reference voltage switch 51, a second reference voltage switch 52, a third reference voltage switch 53, a short-circuit switch 55 and a bypass switch 61.

The configurations except the bypass switch 61 are equal to those of the switched capacitor type digital-analog converter 50 shown in FIG. 15.

An input of the bypass switch 61 is connected to an inversion input of the operational amplifier 9. An output of the bypass switch 61 is connected to an output of the operational amplifier 9. A fourth reference voltage Vr3 is applied to a non-inversion input of the operational amplifier 9. The bypass switch 61 is composed of the high voltage transistors.

The bypass switch 61 carries out the same operation as the fourth reference voltage switch 54 in the switched capacitor type digital-analog converter 50.

The switched capacitor type digital-analog converter 60 is set at the voltage follower at a time of reset. A voltage (Vr3+Voff) is applied to the inversion input of the operational amplifier 9. The voltage Voff is the offset voltage of the operational amplifier 9.

When the switched capacitor type digital-analog converter 60 indicates the reset state of the negative output mode, charges Qrn accumulated in the capacitors 1-0 to 1-n and the capacitor 2 can be represented by the equation (28):

$$Qrn=(Vr3+Voff-Vref)\times 2^n\times C+(Vr3+Voff-Vr2)\times a \times C \quad (28)$$

When the switched capacitor type digital-analog converter 60 indicates the reset state of the positive output mode, charges Qrn accumulated in the capacitors 1-0 to 1-n and the capacitor 2 can be represented by the equation (29):

$$Qrp=(Vr3+Voff-Vref)\times 2^n\times C+(Vr3+Voff-Vr1)\times a \times C \quad (29)$$

When the switched capacitor type digital-analog converter 60 indicates the output state of the negative output mode and the switched capacitor type digital-analog converter 60 indicates the output state of the positive output mode, the switch settings are equal to each other. Charges Qo accumulated in the capacitors 1-0 to 1-n and the capacitor 2 can be represented by the equation (30)

$$Qo=(VA-V1)\times\alpha\times C+(VA-V2)\times(2^n-\alpha)\times C+(VA-Vo)\times Cc \quad (30)$$

The voltage VA when the output voltage Vo becomes stable is represented by (VA=Vr3+Vof) . The Voff is the offset voltage of the operational amplifier 9. When the equation (30) is changed, the equation (31) can be obtained:

$$Qo=(Vr3+Voff-V1)\times\alpha\times C+(Vr3+Voff-V2)\times(2^n-\alpha)\times C+(Vr3+Voff-Vo)\times Cc \quad (31)$$

Qrn=Qo and Qrp=Qo are respectively established from the charge conservation principles. The negative output voltage Von and the positive output voltage Vop can be represented by the equation (32) and the equation (33):

$$Von=\{Vr2+(2^n/a)\times Vref\}-(2^n/a)\times\{V2+(\alpha/2^n)\times(V1-V2)\} \quad (32)$$

$$Vop=\{Vr1+(2^n/a)\times Vref\}-(2^n/a)\times\{V2+(\alpha/2^n)\times(V1-V2)\} \quad (33)$$

In the switched capacitor type digital-analog converter 50 shown in FIG. 15, the output voltage when the offset voltage of the operational amplifier 9 is considered can be represented by the equation (34) and the equation (35):

$$Von=\{Vr2+(2^n/a)\times Vref\}-(2^n/a)\times\{V2+(\alpha/2^n)\times(V1-V2)\}+(1+(2^n/a))\times Voff \quad (34)$$

$$Vop=\{Vr1+(2^n/a)\times Vref\}-(2^n/a)\times\{V2+(\alpha/2^n)\times(V1-V2)\}+(1+(2^n/a))\times Voff \quad (35)$$

The effect $((1+(2^n/a))\times Voff)$ of the offset voltage is induced in the equations (34), (35).

The switched capacitor type digital-analog converter 60 can avoid the effect of the offset voltage. The switched capacitor type digital-analog converter 60 can establish the wider range of the output voltage. The parasitic effect is not easily induced in the switched capacitor type digital-analog converter 60. This configuration can be used when an accuracy is required which is higher than that of the configuration of the fifth embodiment according to the present invention.

The switched capacitor type digital-analog converter according to the present invention employ the switches composed of the low voltage transistors. The low voltage transistor is smaller than the high voltage transistor. It is possible to miniaturize the switched capacitor type digital-analog converter. The low voltage transistor has the consumptive electric power lower than that of the high voltage transistor. It is possible to provide the switched capacitor type digital-analog converter of a low consumptive electric power type.

What is claimed is:

1. A switched capacitor type digital-analog converter comprising:
   an input capacitor group which includes an input capacitor receiving an input signal and the shared input capacitors receiving the input signal which are used to control a capacitance of the input capacitor group;
   a first switch group applying a first voltage to the plurality of shared capacitors; a second switch group applying a second voltage to the input capacitor and the shared input capacitors;
   a reference voltage switch applying a reference voltage to the input capacitor and the shared input capacitors;
   a comparator comparing an output value of the input capacitor group and the reference voltage; an output capacitor including a capacitance which is smaller than a total capacitance of the input capacitor group, and arranged between the input capacitor group and an output of the comparator; and a short circuited switch shorting an input of the output capacitor to an output of thereof.

2. A switched capacitor type digital-analog converter as claimed in claim 1,
   wherein the first switch group, the second switch group and the reference voltage switch are made from a low voltage type transistor and the short circuited switch is made from a high voltage type transistor receiving a high voltage which is higher than a low voltage for the low voltage type transistor from a power source.

3. A switched capacitor type digital-analog converter as claimed in claim 1,
   wherein the first switch group, the second switch group and the reference voltage switch are made from a low voltage type transistor which is activated at the equal to or less than 3.3V and the short circuited switch is made from a high voltage type transistor which is activated at the voltage which exceeds 3.3V.

4. A switched capacitor type digital-analog converter as claimed in claim 1,
   wherein the first switch group, the second switch group and the reference voltage switch are made from a low voltage type transistor which is activated at the equal to or less than 3.3V and the short circuited switch is made from a high voltage type transistor which is activated at the voltage which exceeds 5V.

5. A switched capacitor type digital-analog converter as claimed in claim 1,
   wherein the first voltage is set to a voltage which is higher than the second voltage.

6. A switched capacitor type digital-analog converter as claimed in claim 1,
   wherein the comparator is the operational amplifier that includes an inverting input which receives an output signal from the input capacitor group and a non-inverting input which receives the second voltage or the reference voltage.

7. A switched capacitor type digital-analog converter as claimed in claim 1,
   wherein a capacitance of the shared input capacitor is equal to integer times a capacitance of the input capacitor.

8. A switched capacitor type digital-analog converter comprising,
   an input capacitor group which includes an input capacitor receiving an input signal and the shared input capacitors receiving the input signal which are used to control a capacitance of the input capacitor group;
   a first switch group which including a low voltage type P-channel MOS transistor and/or a low voltage type N-channel MOS transistor and applying a first voltage to the plurality of shared capacitors;
   a second switch group which including a low voltage type P-channel MOS transistor and/or a low voltage type N-channel MOS transistor and applying a second voltage to the input capacitor and the shared input capacitors;
   a reference voltage switch which including a low voltage type P-channel MOS transistor and/or a low voltage type N-channel MOS transistor and applying a reference voltage to the input capacitor and the shared input capacitors;

a comparator comparing an output value of the input capacitor group and the reference voltage; an output capacitor including a capacitance which is smaller than a total capacitance of the input capacitor group and arranged between the input capacitor group, and an output of the comparator; and a short circuited switch which including a high voltage type P-channel MOS transistor and/or a high voltage type N-channel MOS transistor and shorting an input of the output capacitor to an output of thereof.

9. A switched capacitor type digital-analog converter as claimed in claim 8, wherein the first switch group, the second switch group and the reference voltage switch are made from a low voltage type transistor which is activated at the equal to or less than 3.3V and the short circuited switch is made from a high voltage type transistor which is activated at the voltage which exceeds 3.3V.

10. A switched capacitor type digital-analog converter as claimed in claim 8, wherein the first switch group, the second switch group and the reference voltage switch are made from a low voltage type transistor which is activated at the equal to or less than 3.3V and the short circuited switch is made from a high voltage type transistor which is activated at the voltage which exceeds 5V.

11. A switched capacitor type digital-analog converter as claimed in claim 8, wherein the first voltage is set to a voltage which is higher than the second voltage.

12. A switched capacitor type digital-analog converter as claimed in claim 8, wherein the comparator is the operational amplifier that includes an inverting input which receives an output signal from the input capacitor group and a non-inverting input which receives the second voltage or the reference voltage.

13. A switched capacitor type digital-analog converter as claimed in claim 8, wherein a capacitance of the shared input capacitor is equal to integer times a capacitance of the input capacitor.

14. A switched capacitor type digital-analog converter comprising, an input capacitor group which includes an input capacitor receiving an input signal and the shared input capacitors receiving the input signal which are used to control a capacitance of the input capacitor group;

a first switch group which including a low voltage type P-channel MOS transistor and/or a low voltage type N-channel MOS transistor and applying a first voltage to the plurality of shared capacitors;

a second switch group which including a low voltage type P-channel MOS transistor and/or a low voltage type N-channel MOS transistor and applying a second voltage to the input capacitor and the shared input capacitors;

a reference voltage switch which including a low voltage type P-channel MOS transistor and/or a low voltage type N-channel MOS transistor and applying a reference voltage to the input capacitor and the shared input capacitors;

a comparator comparing an output value of the input capacitor group and the reference voltage; an output capacitor including a capacitance which is smaller than a total capacitance of the input capacitor group and arranged between the input capacitor group, and an input of the comparator; and a short circuited switch which including a high voltage type P-channel MOS transistor and/or a high voltage type N-channel MOS transistor and shorting an input of the output capacitor to an output of thereof.

15. A switched capacitor type digital-analog converter as claimed in claim 14, wherein the first switch group, the second switch group and the reference voltage switch are made from a low voltage type transistor which is activated at the equal to or less than 3.3V and the short circuited switch is made from a high voltage type transistor which is activated at the voltage which exceeds 3.3V.

16. A switched capacitor type digital-analog converter as claimed in claim 14, wherein the first switch group, the second switch group and the reference voltage switch are made from a low voltage type transistor which is activated at the equal to or less than 3.3V and the short circuited switch is made from a high voltage type transistor which is activated at the voltage which exceeds 5V.

17. A switched capacitor type digital-analog converter as claimed in claim 14, wherein the first voltage is set to a voltage which is higher than the second voltage.

18. A switched capacitor type digital-analog converter as claimed in claim 14, wherein the comparator is the operational amplifier that includes an inverting input which receives an output signal from the input capacitor group and a non-inverting input which receives the second voltage or the reference voltage.

19. A switched capacitor type digital-analog converter as claimed in claim 14, wherein a capacitance of the shared input capacitor equal to integer times a capacitance of the input capacitor.

* * * * *